United States Patent
Kanda et al.

(10) Patent No.: US 7,247,891 B2
(45) Date of Patent: Jul. 24, 2007

(54) SEMICONDUCTOR DEVICE AND METHOD FOR FABRICATING THE SAME

(75) Inventors: Atsuhiko Kanda, Hyogo (JP); Tsuyoshi Tanaka, Osaka (JP); Yasuhiro Uemoto, Shiga (JP); Yutaka Hirose, Kyoto (JP); Tomohiro Murata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/970,026

(22) Filed: Oct. 22, 2004

(65) Prior Publication Data

US 2005/0087763 A1    Apr. 28, 2005

(30) Foreign Application Priority Data

Oct. 23, 2003    (JP)    ............... 2003-363121

(51) Int. Cl.
  *H01L 29/739*    (2006.01)
(52) U.S. Cl. ........................... 257/194; 257/745
(58) Field of Classification Search ................ 257/744, 257/745, 194, E29.246, E29.247, E29.248, 257/E29.252, E21.403, E21.407
  See application file for complete search history.

(56) References Cited

U.S. PATENT DOCUMENTS

| | | | | |
|---|---|---|---|---|
| 4,714,948 A | * | 12/1987 | Mimura et al. ............. | 257/194 |
| 4,916,498 A | * | 4/1990 | Berenz ...................... | 257/194 |
| 4,996,163 A | * | 2/1991 | Sasaki ........................ | 438/59 |
| 5,406,094 A | * | 4/1995 | Arimoto et al. ............. | 257/24 |
| 5,550,393 A | * | 8/1996 | Nishimura .................. | 257/192 |
| 5,606,184 A | * | 2/1997 | Abrokwah et al. .......... | 257/192 |
| 5,689,125 A | * | 11/1997 | Vaccaro et al. ............. | 257/200 |
| 6,853,016 B2 | * | 2/2005 | Kobayashi .................. | 257/194 |

FOREIGN PATENT DOCUMENTS

JP    2003-59946    2/2003

* cited by examiner

*Primary Examiner*—Sara Crane
(74) *Attorney, Agent, or Firm*—McDermott Will & Emery LLP

(57) ABSTRACT

A semiconductor device has a first nitride semiconductor layer, a second nitride semiconductor layer formed on the first nitride semiconductor layer and having such a composition as to generate a 2-dimensional electron gas layer in the upper portion of the first nitride semiconductor layer, and an electrode having an ohmic property and formed selectively on the second nitride semiconductor layer. The second nitride semiconductor layer includes a contact area having at least one inclined portion with a bottom or wall surface thereof being inclined toward the upper surface of the first nitride semiconductor layer and defining a depressed cross-sectional configuration. The electrode is formed on the contact area.

18 Claims, 16 Drawing Sheets

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2003-363121 filed in Japan on Oct. 23, 2004, the entire contents of which are hereby incorporated by reference.

BACKGROUND OF THE INVENTION

The present invention relates to a semiconductor device composed of a group III-V nitride semiconductor and, more particularly, to a semiconductor device having an ohmic electrode formed on a group III-V nitride semiconductor layer and to a method for fabricating the same.

Studies have been made on the application of a group III-V nitride semiconductor, i.e., a mixed crystal compound semiconductor represented by the general formula $Al_xIn_yGa_{1-x-y}N$ (where x and y satisfy $0 \leq x \leq 1$, $0 \leq y \leq 1$, and $0 \leq x+y \leq 1$) not only to an optical device using a wide band gap and a direct transition band structure, which physically characterize the mixed crystal compound semiconductor, but also to an electronic device using a high breakdown electric field and a high saturation electron velocity, which also characterize the mixed crystal compound semiconductor. In particular, a hetero-junction field effect transistor (hereinafter referred to as HFET) using a 2-dimensional electron gas (hereinafter referred to as 2DEG) appearing at the interface between an $Al_xGa_{1-x}N$ layer (where $0<x \leq 1$ is satisfied) and a GaN layer, each epitaxially grown on a semi-insulating substrate, as well as a hetero-junction bipolar transistor (hereinafter referred to as HBT) have been developed progressively as high-output RF devices.

In the HFET, an electron density is over $10^{13}$ cm$^{-2}$ due to electrons supplied from a carrier supply layer made of, e.g., AlGaN and serving also as an n-type barrier layer and to charges resulting from a polarization effect (spontaneous polarization, i.e., piezo polarization). The electron density is higher than that in a HFET made of an AlGaAs-based compound semiconductor by about one order of magnitude.

In addition, a group III-V nitride semiconductor such as gallium nitride (GaN) features a high breakdown voltage characteristic due to its relatively large band gap energy of 3.4 eV. Because such electric characteristics as a high breakdown voltage and a high current density can be expected, studies have been made on the application of electronic devices using group III-V nitride semiconductors typically represented by the HFET and HBT as ultra-high-speed and large-output devices in smaller sizes.

Although the electronic devices using group III-V nitride semiconductors are thus promising as ultra-high-speed devices and large-output devices, various improvements and modification should be made to realize ultra-high-speed and large-output devices by using such nitride semiconductors.

As a first problem to be solved to realize an ultra-high-speed and large-output device using a group III-V nitride semiconductor, a reduction in contact resistance can be listed.

A description will be given herein below to a conventional GaN semiconductor device (HFET) using a group III-V nitride semiconductor with reference to FIG. 16 (see, e.g., Japanese Laid-Open Patent Publication No. 2003-59946).

As shown in FIG. 16, a GaN semiconductor device A has a first semiconductor layer 3 made of undoped GaN and formed on a substrate 1 with a buffer layer 2 interposed therebetween and a second semiconductor layer 4 made of undoped AlGaN which is larger in band gap energy than the first semiconductor layer 3 and formed on the first semiconductor layer 3. Consequently, a 2DEG layer 6 is formed in the region of the first semiconductor layer 3 located in the vicinity of the interface with the second semiconductor layer 4.

A Schottky gate electrode G is formed on the second semiconductor layer 4. The upper portions of the regions of the second semiconductor layer 4 located on both sides of the gate electrode G are partly removed such that two contact areas 4A are formed. A source electrode S and a drain electrode D, each of which is an ohmic electrode, are formed on the respective contact areas 4A. The exposed surface of the second semiconductor layer 4 is covered with an insulating film 7.

Thus, the conventional GaN semiconductor device A forms the contact areas 4A as regions to be formed with the ohmic electrodes by partly removing the upper portions of the second semiconductor layer 4 for generating the 2DEG layer 6 in the first semiconductor layer 3 and thereby reduces the distance between the 2DEG layer 6 and each of the ohmic electrodes S and D such that the contact resistance between the first semiconductor layer 3 and each of the ohmic electrodes S and D is reduced.

However, the conventional GaN semiconductor device mentioned above has the problems of a damage to the second semiconductor layer 4 caused by etching during the formation of the contact areas 4A and a reduction in the concentration of an electron gas in the 2DEG layer 6 caused by the etching damage to the second semiconductor layer 4.

Although the surface of the second semiconductor layer 4, especially the surface portions thereof located on both sides of the gate electrode G are covered with the insulating film 7, a leakage current (gate leakage) easily flows between the gate electrode G and the second semiconductor layer 4 under the influence of a surface level resulting from the exposure of the end faces. As a result, the electric characteristics (operating characteristics) of the device deteriorate even though the contact resistance is reduced.

There is also the problem that it is difficult to determine the end point of etching for forming the contact areas 4A having a depressed configuration.

SUMMARY OF THE INVENTION

It is therefore an object of the present invention to solve the foregoing conventional problems and improve the operating characteristics of a device, while reducing the contact resistance of an ohmic electrode provided on a group III-V nitride semiconductor.

As a result of making various studies for a reduction in the contact resistance of the ohmic electrode provided on the group III-V nitride semiconductor, the present inventors have made the following finding. That is, the mere lowering of the level of the upper surface of the second semiconductor layer 4 in parallel relation to the upper surface of the first semiconductor layer 3 reduces the series resistance component of an ohmic contact but also reduces the concentration of an electron gas in the 2DEG layer 6 disadvantageously. Thus, a reduction in contact resistance and an increase in the concentration of the electron gas have a trade-off relationship therebetween.

Based on the finding, a first semiconductor device according to the present invention is constructed as a semiconductor device having a first semiconductor layer and a second semiconductor layer formed on the first semiconductor layer to generate a 2DEG layer in the upper portion of the first semiconductor layer, wherein the second semiconductor layer is formed with an ohmic contact area having at least one part thereof inclined toward the upper surface of the first semiconductor layer to define a depressed cross-sectional configuration.

A second semiconductor device according to the present invention is constructed such that a first semiconductor layer is formed with an ohmic contact area in direct contact with a 2DEG layer formed in the first semiconductor layer.

A third semiconductor device according to the present invention is constructed such that a third semiconductor layer containing an impurity is buried in the region of a second semiconductor layer located under an ohmic contact area.

A fourth semiconductor device according to the present invention is constructed such that the portion of a second semiconductor layer to be formed with an ohmic contact area is selectively removed, an impurity is introduced into the bottom portion of a depressed portion resulting from the selective removal, and the inner wall of the depressed portion is covered with an insulating film.

A fifth semiconductor device according to the present invention is constructed such that even a structure obtained by providing a third semiconductor layer serving as a so-called cap layer on a second semiconductor layer is provided with the structure of the first semiconductor device according to the present invention, i.e., with a structure in which a third semiconductor layer is formed with an ohmic contact area having at least one part thereof inclined toward the upper surface of a second semiconductor layer to define a depressed cross-sectional configuration.

A sixth semiconductor device according to the present invention is aimed at a laser device or HBT made of, e.g., a group III-V nitride semiconductor and not having a 2DEG layer which is constructed such that the upper surface of an ohmic contact area is selectively lowered to a level coincident with or in the vicinity of the peak position of a carrier concentration in a semiconductor layer containing carriers.

Specifically, a first semiconductor device according to the present invention comprises: a first nitride semiconductor layer; a second nitride semiconductor layer formed on the first nitride semiconductor layer and having such a composition as to generate a 2-dimensional electron gas (2DEG) layer in an upper portion of the first nitride semiconductor layer; and an electrode having an ohmic property and formed selectively on the second nitride semiconductor layer, wherein the second nitride semiconductor layer includes a contact area having at least one inclined portion whose bottom or wall surface is inclined toward an upper surface of the first nitride semiconductor layer and defining a depressed cross-sectional configuration and the electrode is formed on the contact area.

In the first semiconductor device, the distance between the lowermost portion of the contact area and the 2DEG layer linearly changes. Consequently, the contact area having the inclined portion has at least one optimum region where the contact resistance is reduced and the concentration of an electron gas has a sufficient value. This allows improvements in the operating characteristics of the device, while achieving a reduction in the contact resistance of the ohmic electrode. As a result, it becomes possible to implement a higher-speed and higher-output semiconductor device using a group III-V nitride semiconductor.

In the first semiconductor device, a lowermost portion of the contact area is preferably positioned at a distance of not less than 1 nm and not more than 1 µm from the 2-dimensional electron gas layer.

In the first semiconductor device, a bottom portion of the contact area is preferably formed with a striped pattern which is projecting and depressed in cross section with a periodicity of 1 nm to 1 µm. In the arrangement, the contact area has a plurality of optimum regions where the contact resistance is reduced and the concentration of the electron gas has a sufficient value so that the contact resistance of the ohmic electrode is further reduced.

In the first semiconductor device, the electrode is preferably formed to cover at least one of the bottom surface and the wall surface of the contact area. In the arrangement, a leakage current flowing via a surface level developed at the wall surface is absorbed by the ohmic electrode so that the operating characteristics are improved.

A first method for fabricating a semiconductor device according to the present invention comprises the steps of: forming, on a first nitride semiconductor layer, a second nitride semiconductor layer having such a composition as to form a 2-dimensional electron gas layer in an upper portion of the first nitride semiconductor layer; selectively forming, in an upper portion of the second nitride semiconductor layer, a contact area having at least one inclined portion whose bottom or wall surface is inclined toward an upper surface of the first nitride semiconductor layer and defining a depressed cross-sectional configuration; and forming an electrode having an ohmic property on the contact area.

According to the first method for fabricating a semiconductor device, the effects achieved by the first semiconductor device are obtainable. In addition, due to the inclined bottom portion of the contact area, if the contact area is formed by etching, an optimum region where the contact resistance is reduced and the concentration of an electron gas has a sufficient value necessarily exists even though the end point of the etching slightly shifts upward or downward. This prevents the characteristics of the device from being adversely affected.

In the first method for fabricating a semiconductor device, the step of forming the contact area preferably includes the steps of: forming a resist film on the second nitride semiconductor layer and exposing a region of the resist film for forming the contact area at a dosage to a degree that the resist film is not exposed completely by using an interference exposure process to form a periodic striped pattern which is projecting and depressed in cross section in the contact area forming region of the resist film; and performing etching with respect to the second nitride semiconductor layer by using the resist film formed with the periodic pattern as a mask to transfer the periodic pattern onto the contact area of the second nitride semiconductor layer.

The arrangement ensures the formation of the periodic striped pattern which is projecting and depressed in cross section in the contact area of the second nitride semiconductor layer.

In the first method for fabricating a semiconductor device, the step of forming the contact area preferably includes the steps of: forming a resist film on the second nitride semiconductor layer and exposing the resist film to an electron beam to cause a proximity effect on a region of the resist film for forming the contact area by using an electron beam exposure process to form a periodic striped pattern which is projecting and depressed in cross section in the contact area forming region of the resist film; and performing etching with respect to the second nitride semiconductor layer by using the resist film formed with the periodic pattern by a mask to transfer the periodic pattern onto the contact area of the second nitride semiconductor layer.

The arrangement ensures the formation of the periodic striped pattern which is projecting and depressed in cross section in the contact area of the second nitride semiconductor layer.

In the first method for fabricating a semiconductor device, the step of forming the contact area preferably includes the step of irradiating a region of the second nitride semiconductor layer to be formed into the contact area with an ion beam to form a periodic striped pattern which is projecting and depressed in cross section in the contact area of the second nitride semiconductor layer.

The arrangement ensures the formation of the periodic striped pattern which is projecting and depressed in cross section in the contact area of the second nitride semiconductor layer.

A second semiconductor device according to the present invention comprises: a first nitride semiconductor layer; a second nitride semiconductor layer formed on the first nitride semiconductor layer, including a contact area exposing a part of the first nitride semiconductor layer, and having such a composition as to generate a 2-dimensional electron gas (2DEG) layer in an upper portion of the first nitride semiconductor layer; and an electrode having an ohmic property and formed on the contact area, wherein the contact area is a stepped portion composed of an exposed portion formed by partly lowering an upper surface of the first nitride semiconductor layer to a level reaching the 2-dimensional electron gas layer and an end portion facing the exposed portion of the second nitride semiconductor layer and the electrode is formed to cover the stepped portion.

In the second semiconductor device, the contact area has been formed into the stepped portion and the ohmic electrode has been formed to cover the stepped portion so that the electrode is allowed to be in direct contact with the 2DEG layer. This not only reduces the contact resistance of the ohmic electrode but also reduces a channel resistance and thereby allows significant improvements in the operating characteristics of the device.

In the second semiconductor device, an impurity having a conductivity has preferably been introduced into a region of the stepped portion located in the vicinity of an interface between the first and second nitride semiconductor layers. In the arrangement, a potential barrier at the interface between the first and second nitride semiconductor layers is reduced so that the contact resistance of the ohmic electrode is further reduced.

In this case, silicon may be used as an n-type impurity and magnesium may be used as a p-type impurity.

A third semiconductor device according to the present invention comprises: a first nitride semiconductor layer; a second nitride semiconductor layer formed on the first nitride semiconductor layer, having a contact area forming region defining a depressed cross-sectional configuration, and having such a composition as to generate a 2-dimensional electron gas layer in an upper portion of the first nitride semiconductor layer; and an electrode having an ohmic property and formed selectively on the second nitride semiconductor layer, wherein the second nitride semiconductor layer includes a contact area composed of a third nitride semiconductor layer containing a first impurity having a conductivity and buried in the contact area forming region and the electrode is formed on the contact area.

In the third semiconductor device, the potential barrier between the electrode and the second nitride semiconductor layer can be reduced by providing the third nitride semiconductor layer containing the first impurity. This achieves a reduction in the contact resistance of the ohmic electrode without reducing the concentration of an electron gas in the 2DEG layer and allows improvements in the operating characteristics of the device.

In this case, a second impurity having the same conductivity as the first impurity has preferably been introduced into a bottom portion of the contact area forming region of the second nitride semiconductor layer. In the arrangement, a potential barrier in the region of the second nitride semiconductor layer in the vicinity of the interface with the third nitride semiconductor layer can also be reduced so that the contact resistance of the ohmic electrode is further reduced.

In this case, silicon may be used as the first and second impurities and magnesium may be used as the first and second impurities.

A third method for fabricating a semiconductor device according to the present invention comprises the steps of: forming, on a first nitride semiconductor layer, a second nitride semiconductor layer having such a composition as to form a 2-dimensional electron gas layer in an upper portion of the first nitride semiconductor layer; selectively forming a contact area forming region defining a depressed cross-sectional configuration in an upper portion of the second nitride semiconductor layer; forming and burying a third nitride semiconductor layer in the contact area forming region of the second nitride semiconductor layer, while introducing a first impurity having a conductivity therein, to form a contact area composed of the third nitride semiconductor layer in the contact area forming region; and forming an electrode having an ohmic property on the contact area.

Preferably, the third method for fabricating a semiconductor device further comprises, prior to forming the contact area, the step of: introducing a second impurity having the same conductivity as the first impurity into a bottom portion of the contact area forming region of the second nitride semiconductor layer.

A fourth semiconductor device according to the present invention comprises: a first nitride semiconductor layer; a second nitride semiconductor layer formed on the first nitride semiconductor layer and having such a composition as to generate a 2-dimensional electron gas layer in an upper portion of the first nitride semiconductor layer; and an electrode having an ohmic property and formed selectively on the second nitride semiconductor layer, wherein the second nitride semiconductor layer has a contact area defining a depressed cross-sectional configuration, the contact area has a bottom portion containing an impurity having a conductivity introduced therein and a sidewall composed of an insulating film on an inner wall surface thereof, and the electrode is formed to cover an inner side of the contact area including the sidewall.

In the fourth semiconductor device, the sidewall composed of the insulating film can suppress a leakage current caused in the wall surface by the damage undergone by the wall surface during the processing of the contact area defining a depressed cross-sectional configuration. This allows improvements in the operating characteristics of the device, while achieving a reduction in the contact resistance of the ohmic electrode.

A fourth method for fabricating a semiconductor device according to the present invention comprises the steps of: forming, on a first nitride semiconductor layer, a second nitride semiconductor layer having such a composition as to form a 2-dimensional electron gas layer in an upper portion of the first nitride semiconductor layer; selectively forming a contact area defining a depressed cross-sectional configuration in an upper portion of the second nitride semiconductor layer; forming an insulating film on the second nitride semiconductor layer to cover an entire surface thereof including the contact area; performing an etch-back process with respect to the formed insulating film to form a sidewall composed of the insulating film on an inner wall surface of the contact area; introducing an impurity having a conductivity into a bottom portion of the contact area of the second nitride semiconductor layer; and forming an electrode having an ohmic property such that an inner side of the contact area including the sidewall is covered therewith.

A fifth semiconductor device according to the present invention comprises: a first nitride semiconductor layer; a second nitride semiconductor layer formed on the first nitride semiconductor layer and having such a composition as to generate a 2-dimensional electron gas layer in an upper portion of the first nitride semiconductor layer; a third nitride semiconductor layer formed on the second nitride semiconductor layer and smaller in band gap energy than the second nitride semiconductor layer; and an electrode having an ohmic property and formed selectively on the third nitride semiconductor layer, wherein the third nitride semiconductor layer includes a contact area having at least one inclined portion whose bottom or wall surface is inclined toward an upper surface of the second nitride semiconductor layer and defining a depressed cross-sectional configuration and the electrode is formed on the contact area.

In each of the first to fifth semiconductor devices, for the electrode having an ohmic property, there may be used one layer made of a metal selected from the group consisting of titanium, strontium, aluminum, niobium, vanadium, zirconium, hafnium, chromium, tungsten, molybdenum, rhodium, rhenium, cobalt, and lanthanum, at least two layers each made of a metal selected from the group, an alloy layer containing at least two metals selected from the group, or a conductive compound containing at least one metal selected from the group and oxygen, nitrogen, or boron.

In each of the first to fourth semiconductor devices, a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$), a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$), and a composition of the second nitride semiconductor layer and a composition of the first nitride semiconductor layer are preferably such that u representing an Al ratio is larger than x representing an Al ratio and v representing an In ratio is smaller than y representing an In ratio.

In the fifth semiconductor device, a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$), a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$), a general formula of a material composing the third nitride semiconductor layer is $Al_lIn_mGa_{1-l-m}N$ (where l and m satisfy $0 \leq l \leq 1$, $0 \leq m \leq 1$, and $0 \leq l+m \leq 1$), a composition of the second nitride semiconductor layer and a composition of the first nitride semiconductor layer are preferably such that u representing an Al ratio is larger than x representing an Al ratio and v representing an In ratio is smaller than y representing an In ratio, and a composition of the third nitride semiconductor layer and the composition of the second nitride semiconductor layer are preferably such that l representing an Al ratio is smaller than u representing the Al ratio and m representing an In ratio is larger than v representing the In ratio.

A sixth semiconductor device according to the present invention comprises: a semiconductor layer having a carrier concentration that varies along a direction of depth; and an electrode having an ohmic property and formed selectively on the semiconductor layer, wherein the semiconductor layer has a contact area formed by partly removing an upper portion thereof and the electrode is formed in the contact area.

In the sixth semiconductor device, the contact resistance between the electrode and the semiconductor layer can be reduced and the operating characteristics of the device can be improved.

In the sixth semiconductor device, the contact area preferably has a lowermost portion thereof positioned at a distance of not less than 1 nm and not more than 50 nm from a peak position of the carrier concentration in the semiconductor layer located therebelow.

In the sixth semiconductor device, the contact area preferably has a lowermost portion thereof disposed at a position coincident with a peak position of the carrier concentration in the semiconductor layer.

In the sixth semiconductor device, the semiconductor layer is preferably made of a group III-V nitride semiconductor represented by a general formula $Al_xIn_yGa_{1-x-y}N$ (where x and y satisfy $0 \leq x \leq 1$, $0 \leq y \leq 1$, and $0 \leq x+y \leq 1$).

In the sixth semiconductor device, the electrode having an ohmic property preferably contains platinum or palladium.

DESCRIPTION OF THE PREFERRED EMBODIMENTS

Embodiment 1

A first embodiment of the present invention will be described with reference to the drawings.

Figure 1:
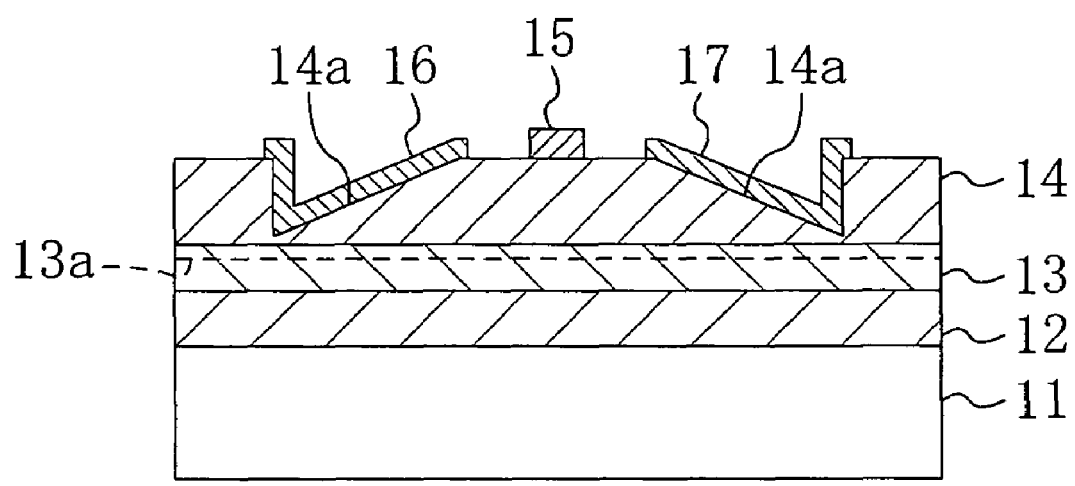
FIG. 1 is a structural cross-sectional view showing a semiconductor device according to a first embodiment of the present invention.

FIG. 1 shows a cross-sectional structure of a HFET as a semiconductor device according to the first embodiment. As shown in FIG. 1, a buffer layer 12 made of aluminum nitride (AlN) or gallium nitride (GaN) with a thickness of about 1 μm, a first nitride semiconductor layer 13 made of gallium nitride (GaN) with a thickness of about 1 μm and a low concentration of n-type carriers, i.e., i (intrinsic)-type gallium nitride, and a second nitride semiconductor layer 14 made of i-type aluminum gallium nitride ($Al_{0.26}Ga_{0.74}N$) with a thickness of about 25 nm are formed successively on a substrate 11 made of silicon carbide (SiC).

Since $Al_{0.26}Ga_{0.74}N$ composing the second nitride semiconductor layer 14 is larger in electron band gap energy than GaN composing the first nitride semiconductor layer 13, a 2DEG layer 13a is formed in the region of the first nitride semiconductor layer 13 located in the vicinity of the interface with the second nitride semiconductor layer 14, more specifically at a depth of about 10 nm from the interface.

A gate electrode 15 composed of a multilayer film made of, e.g., nickel (Ni) and gold (Au) is formed on the second nitride semiconductor layer 14 in Schottky contact therewith. The regions of the second nitride semiconductor layer 14 located on both sides of the gate electrode 15 have been formed into contact areas 14a each having an inclined portion with a bottom surface (upper surface) thereof being inclined outwardly toward the upper surface of the first nitride semiconductor layer 13 and defining a depressed cross-sectional configuration. On the respective contact areas 14a, ohmic source and drain electrode 16 and 17 (having an ohmic property) each composed of a multilayer film made of, e.g., titanium (Ti) and aluminum (Al) are formed to cover the respective bottom and wall surfaces of the contact areas 14a.

Preferably, the second nitride semiconductor layer 14 has a thickness of about 2 nm to 1 μm.

Preferably, the lowermost portion of each of the contact areas 14a is positioned at a distance of not less than 1 nm from the 2 DEG layer 13a. When the thickness of the second nitride semiconductor layer 14 is over 1 μm, the lowermost portion of each of the contact areas 14a is positioned at a distance of not more than 1 μm from the 2 DEG layer 13a.

Thus, according to the first embodiment, the second nitride semiconductor layer 14 which generates the 2DEG layer 13a in the upper portion of the first nitride semiconductor layer 13 has the contact areas 14a each having the inclined portion with the bottom surface thereof being inclined toward the upper surface of the first nitride semiconductor layer 13 and defining a depressed cross-sectional configuration so that the distance between the lowermost portion of each of the contact areas 14a and the 2DEG layer 13a changes linearly. It follows therefore that each of the contact areas 14a having the inclined bottom portions has at least one optimum region where the contact resistance is reduced and the concentration of an electron gas has a sufficient value. As a result, it becomes possible to improve the operating characteristics of the device with the 2DEG layer 13a having a sufficient electron gas concentration, while reducing the contact resistance of each of the ohmic source and drain electrodes 16 and 17.

Figure 2A:
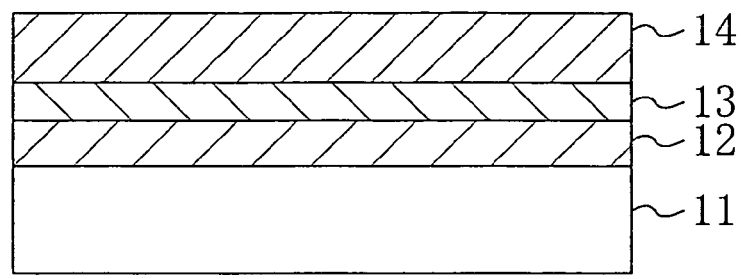
FIGS. 2A to 2C are structural cross-sectional views illustrating the semiconductor device according to the first embodiment in the individual process steps of a fabrication method therefor.
Figure 2B:
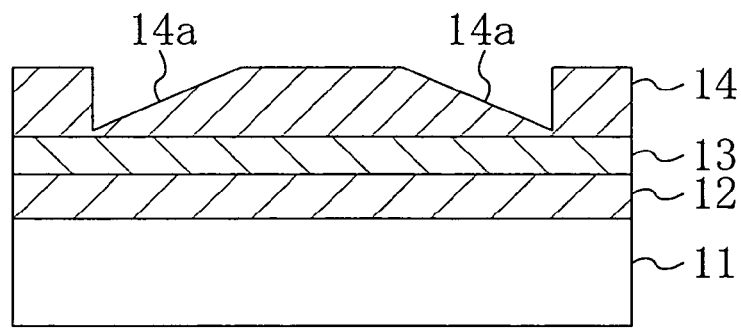
Figure 2C:
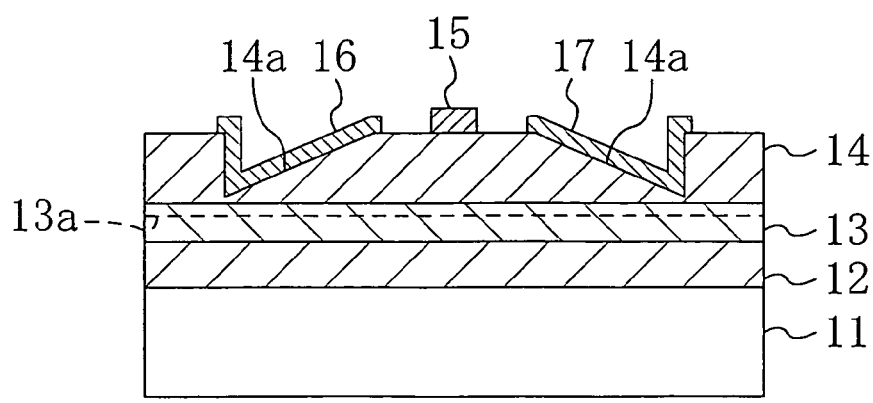

A description will be given herein below to a method for fabricating the HFET thus constructed with reference to the drawings. FIGS. 2A to 2C show the cross-sectional structures of the HFET according to the first embodiment in the individual process steps of the fabrication method.

First, as shown in FIG. 2A, the buffer layer 12 made of aluminum nitride or gallium nitride, the first nitride semiconductor layer 13 made of i-type gallium nitride, and the second nitride semiconductor layer 14 made of i-type aluminum gallium nitride ($Al_{0.26}Ga_{0.74}N$) are grown successively on the substrate 11 made of silicon carbide by, e.g., metalorganic chemical vapor deposition (MOCVD). The method for depositing each of the nitride semiconductor layers is not limited to MOCVD. Instead of MOCVD, it is also possible to use molecular beam epitaxy (MBE).

Next, as shown in FIG. 2B, the contact areas 14a each having the inclined portion with the bottom surface thereof being inclined toward the upper surface of the first nitride semiconductor layer 13 and defining a depressed cross-sectional configuration are formed in mutually spaced apart relation by lithography and dry etching using a chlorine gas which are performed by using, as a mask, a first resist pattern (not shown) having openings corresponding to the contact area forming regions. To form the contact areas 14a with the inclined portions having the inclined bottom surfaces, the openings (depressed portions) of the resist pattern are formed with portions inclined in the direction of depth. Specifically, the resist pattern is formed with the portions inclined in the direction of depth by performing pattern exposure at an over dose or by performing an additional thermal process after normal patterning.

Next, as shown in FIG. 2C, the first resist pattern is removed by ashing or the like and then a second resist pattern (not shown) having openings for exposing the contact areas 14a is formed by lithography on the second nitride semiconductor layer 14. On the second resist pattern formed, an electrode forming film composed of a multilayer film made of titanium and aluminum is deposited by, e.g., electron beam vapor deposition. Then, the ohmic source and drain electrodes 16 and 17 composed of the electrode forming film are formed on the respective contact areas 14a by a so-called lift-off process for removing the unwanted portion of the deposited electrode forming film together with the second resist pattern. Subsequently, a third resist pattern (not shown) having an opening for exposing a region to be formed with a gate electrode between the source and drain electrodes 16 and 17 is formed and a gate electrode forming film made of nickel and gold is deposited by, e.g., electron beam vapor deposition. By further performing a lift-off process, the gate electrode 15 is formed from the gate electrode forming film. It is to be noted that the order in which the source and drain electrodes 16 and 17 and the gate electrode 15 are formed is insignificant.

In the first embodiment, each of the contact areas 14a has a cross section configured as an inverted right angle triangle which is inclined more deeply with distance from the corresponding one of the side surfaces of the gate electrode 15 and the source and drain electrodes 16 and 17 are formed to cover the respective inclined portions and inner wall surfaces of the contact areas 14a and have the end portions thereof reaching the upper surface of the second nitride semiconductor layer 14. As a result, the respective wall surfaces of the contact areas 14a which are substantially perpendicular to the substrate surface are positioned externally of the gate electrode 15 so that a leakage current resulting from a surface level which easily occurs at the wall surface of the second nitride semiconductor layer 14 is suppressed. Since the source and drain electrodes 16 and 17 are completely covering the respective bottom surfaces (inclined portions) and wall surfaces of the contact areas 14a, portions damaged by etching during the formation of the contact areas 14a are not exposed so that the operating characteristics of the transistor are prevented from being adversely affected by the etching damage.

A description will be given herein below to other structural examples of the cross-sectional configuration of each of the contact areas 14a for forming ohmic electrodes provided in the second nitride semiconductor layer 14 and the configuration of each of the ohmic electrodes with respect to FIGS. 3A to 3E.

Although each of the structural examples does not satisfy the two conditions requiring the provision of the respective wall surfaces of the contact areas 14a which are substantially perpendicular to the substrate surface on the opposite sides of the gate electrode 15 and the complete coverage of the respective inner surfaces of the contact areas 14a with the electrodes, each of the contact areas 14a is formed with a region close to the 2DEG layer and a region far away therefrom in the direction of depth because the bottom surface of each of the contact areas 14a is inclined relative to the upper surface of the first nitride semiconductor layer 13. This achieves the effect of providing at least one optimum region where the contact resistance of each of the source and drain electrodes 16 and 17 as the ohmic electrodes is reduced and the concentration of an electron gas has a sufficient value. As a result, it becomes possible to improve the operating characteristics of the device, while reducing the contact resistance of each of the ohmic electrodes 16 and 17.

Figure 3A:
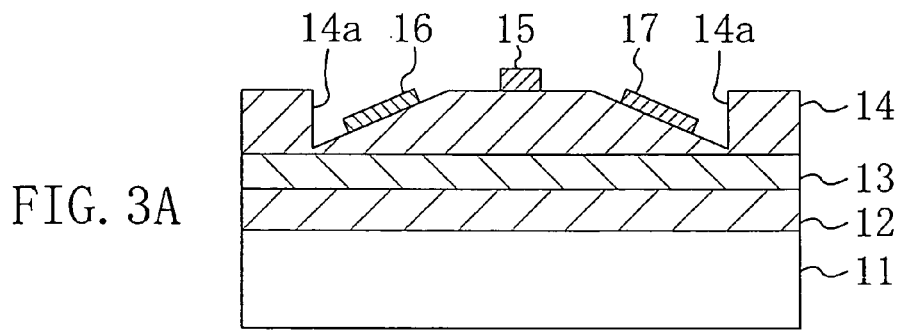
FIGS. 3A to 3E are cross-sectional views each showing a structural example of each of ohmic electrodes in the semiconductor device according to the first embodiment.

In the first structural example shown in FIG. 3A, the cross-sectional configuration of each of the contact areas 14a is the same as in the first embodiment but each of the source and drain electrodes 16 and 17 as the ohmic electrodes is formed only on a part of the inclined portion (bottom surface) of the corresponding one of the contact areas 14a. The arrangement saves materials for forming the ohmic electrodes.

Figure 3B:
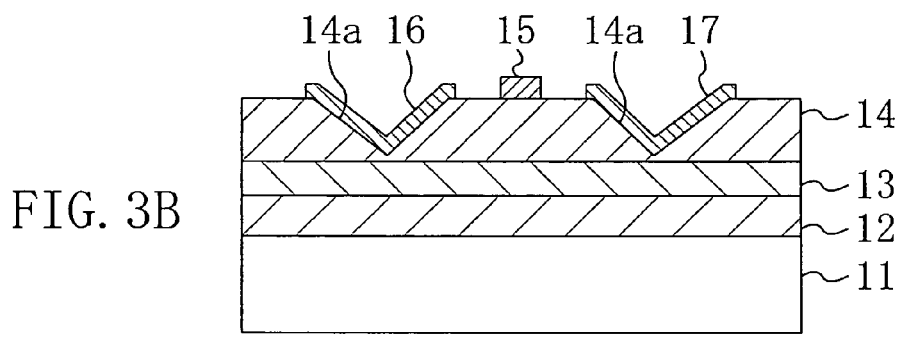

In the second structural example shown in FIG. 3B, each of the contact areas 14a has a cross section configured as an inverted isosceles (V-shaped) triangle. The arrangement allows easier processing of the contact areas 14a than in the case where the cross section of each of the contact areas 14a is an inverted right triangle.

Figure 3C:
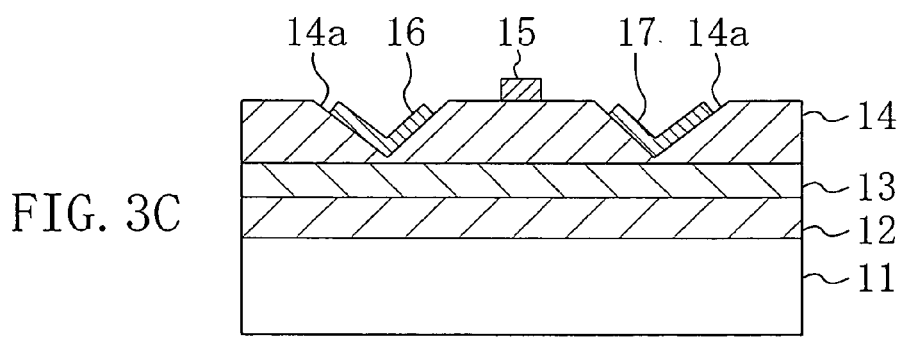

In the third structural example shown in FIG. 3C, each of the ohmic electrodes 16 and 17 is formed on a part of the bottom surface of the corresponding one of the contact areas 14a each having a V-shaped cross-sectional configuration according to the second structural example.

Figure 3D:
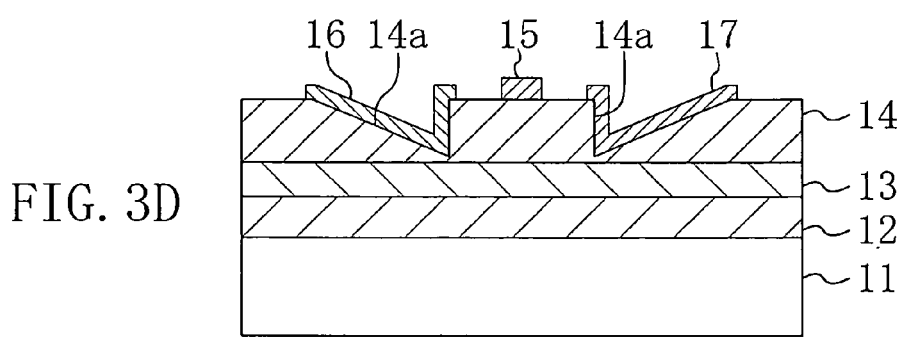

In the fourth structural example shown in FIG. 3D, the inclined portion of each of the contact areas 14a is formed to have a cross section configured as an inverted right triangle which is inclined more deeply with approach toward the corresponding one of the side surfaces of the gate electrode 15 and the ohmic electrodes 16 and 17 are formed to cover the respective bottom and wall surfaces of the contact areas 14a.

Figure 3E:
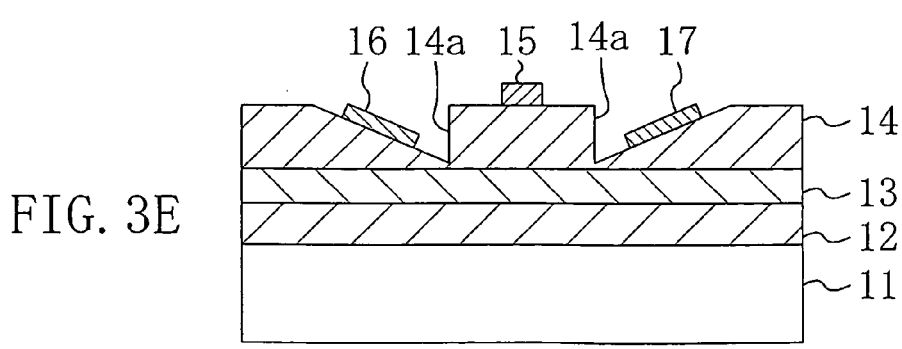

In the fifth structural example shown in FIG. 3E, each of the ohmic electrodes 16 and 17 is formed on a part of the bottom surface of the corresponding one of the contact areas 14a according to the fourth structural example.

Embodiment 2

A second embodiment of the present invention will be described with reference to the drawings.

Figure 4:
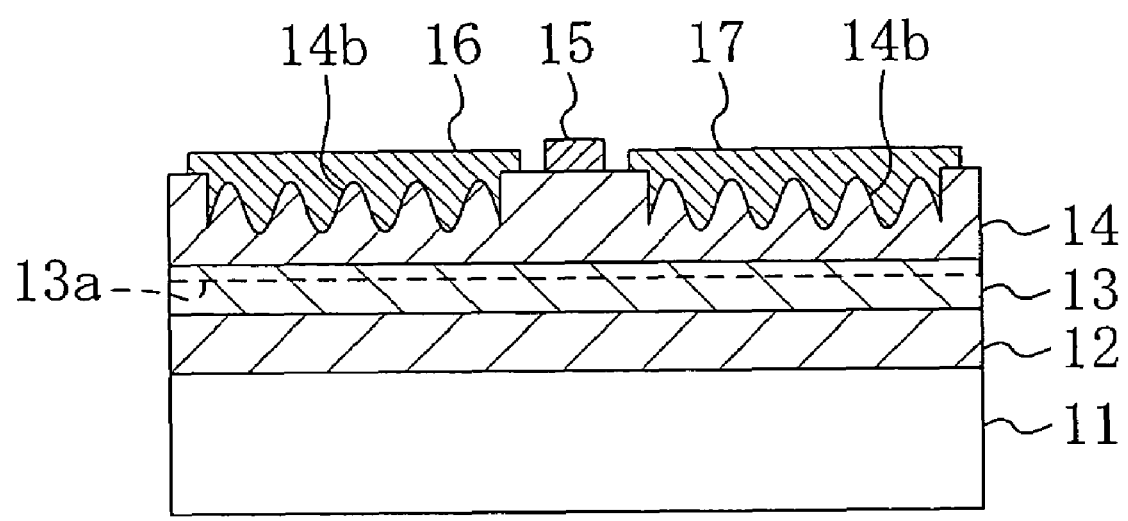
FIG. 4 is a structural cross-sectional view showing a semiconductor device according to a second embodiment of the present invention.

FIG. 4 shows a cross-sectional structure of a HFET as a semiconductor device according to the second embodiment. The description of the components shown in FIG. 4 which are the same as those shown in FIG. 1 will be omitted by retaining the same reference numerals.

Each of contact areas 14b provided in the second nitride semiconductor layer 14 according to the second embodiment is formed with a striped pattern which is projecting and depressed in cross section with a periodicity of 1 nm to 1 μm.

In the arrangement, each of the contact areas 14b has a plurality of optimum regions equal in number to the periodicity where the contact resistance is reduced and the concentration of an electron gas has a sufficient value so that the contact resistance of each of the ohmic electrodes 16 and 17 is further reduced.

Preferably, the second nitride semiconductor layer 14 according to the second embodiment has a thickness of about 2 nm to 1 μm.

Preferably, the deepest portion of each of the contact areas 14b is positioned at a distance of not less than 1 nm and not more than 1 μm from the upper surface of the 2DEG layer 13a.

Figure 5A:
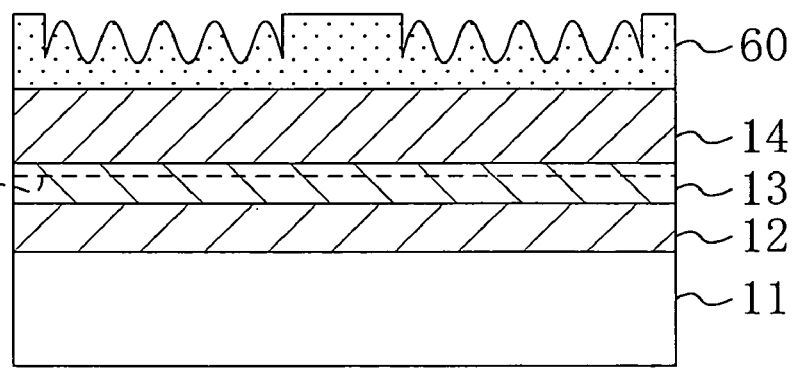
FIGS. 5A to 5C are structural cross-sectional views illustrating the semiconductor device according to the second embodiment in the individual process steps of a fabrication method therefor.
Figure 5B:
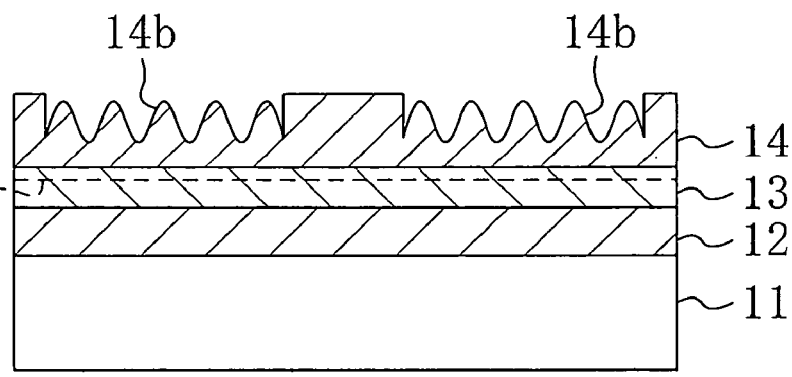
Figure 5C:
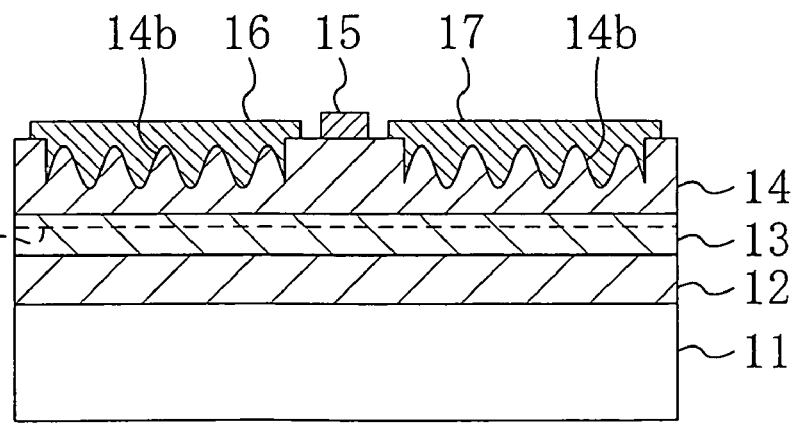

A description will be given herein below to a method for fabricating the HFET thus constructed with reference to the drawings. FIGS. 5A to 5C show the cross-sectional structures of the HFET according to the second embodiment in the individual process steps of the fabrication method.

First, as shown in FIG. 5A, the buffer layer 12 made of aluminum nitride (AlN) or gallium nitride (GaN), the first nitride semiconductor layer 13 made of i-type gallium nitride (GaN), and the second nitride semiconductor layer 14 made of i-type aluminum gallium nitride ($Al_{0.26}Ga_{0.74}N$) are grown successively on the substrate 11 made of silicon carbide (SiC) by, e.g., MOCVD. As a method for depositing each of the nitride semiconductor layers, MBE may also be used instead of MOCVD.

Subsequently, a resist film 60 is coated on the second nitride semiconductor layer 14 and then interference exposure is performed in a lithographic step, while the regions of the resist film 60 for forming contact areas are exposed in an under-dose condition in which a dosage is lower than normally, whereby the periodic striped pattern which is projecting and depressed in cross section is formed in the contact area forming regions of the resist film 60. Thus, the portions of the resist film 60 corresponding to the spaces of the line-and-space periodic pattern formed therein are not opened (penetrated).

Next, dry etching using a chlorine gas is performed with respect to the second nitride semiconductor layer by using, as a mask, the resist film 60 formed with the periodic pattern. The resist film 60 is then removed, whereby the periodic pattern is transferred onto the contact areas 14b of the second nitride semiconductor layer 14, as shown in FIG. 5B.

Next, as shown in FIG. 5C, a first resist pattern (not shown) having openings for exposing the contact areas 14b is formed by lithography on the second nitride semiconductor layer 14. On the first resist pattern formed, an electrode forming film composed of a multilayer film made of titanium and aluminum is deposited by, e.g., electron beam vapor deposition. Then, the ohmic source and drain electrodes 16 and 17 composed of the electrode forming film are formed on the respective contact areas 14a by a so-called lift-off process. Subsequently, a second resist pattern (not shown) having an opening for exposing a region to be formed with a gate electrode between the source and drain electrodes 16 and 17 is formed and a gate electrode forming film composed of a multilayer film made of nickel and gold is deposited by, e.g., electron beam vapor. deposition. By further performing a lift-off process, the gate electrode 15 is formed from the gate electrode forming film. It is to be noted that the order in which the source and drain electrodes 16 and 17 and the gate electrode 15 are formed is also insignificant herein.

Figure 14A:
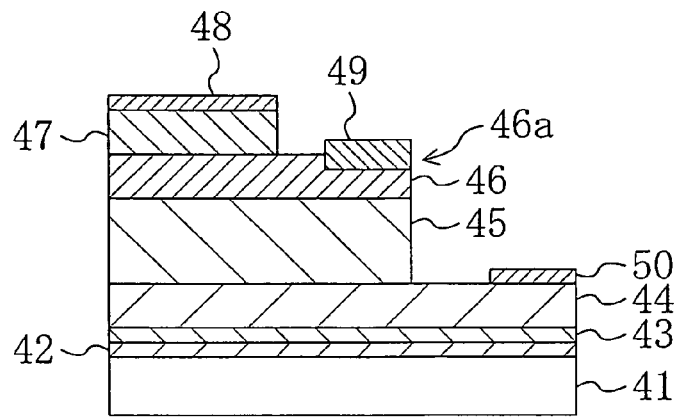
FIG. 14A is a structural cross-sectional view showing a semiconductor device according to an eighth embodiment of the present invention.

Preferably, the periodic pattern provided in each of the contact areas 14b is oriented in a direction in which a current flows, i.e., in a direction perpendicular to the direction in which the source and drain electrodes 16 and 17 are opposed to each other, as shown in FIG. 14.

Variation 1 of Fabrication Method

A description will be given to a first variation of the method for forming the periodic pattern in the bottom portion of each of the contact areas 14b.

For example, electron beam exposure is performed to exert a proximity effect on the contact area forming regions of the resist film 60 and thereby form the periodic striped pattern which is projecting and depressed in cross section in the contact area forming regions. Herein, the proximity effect means a phenomenon that respective unexposed parts of patterns adjacent to each other are slightly exposed by ion beams implanted to the patterns. Thereafter, dry etching is performed with respect to the second nitride semiconductor layer 14 by using the resist film 60 formed with the periodic pattern as a mask in the same manner as in the second embodiment.

Variation 2 of Fabrication Method

As a second variation, the periodic striped pattern which is projecting and depressed in cross section may also be formed in each of the contact areas 14b of the second nitride semiconductor layer 14 by directly irradiating the contact area forming regions of the second nitride semiconductor layer 14 with a beam of argon (Ar) ions or the like without using the resist film 60.

Embodiment 3

A third embodiment of the present invention will be described with reference to the drawings.

Figure 6:
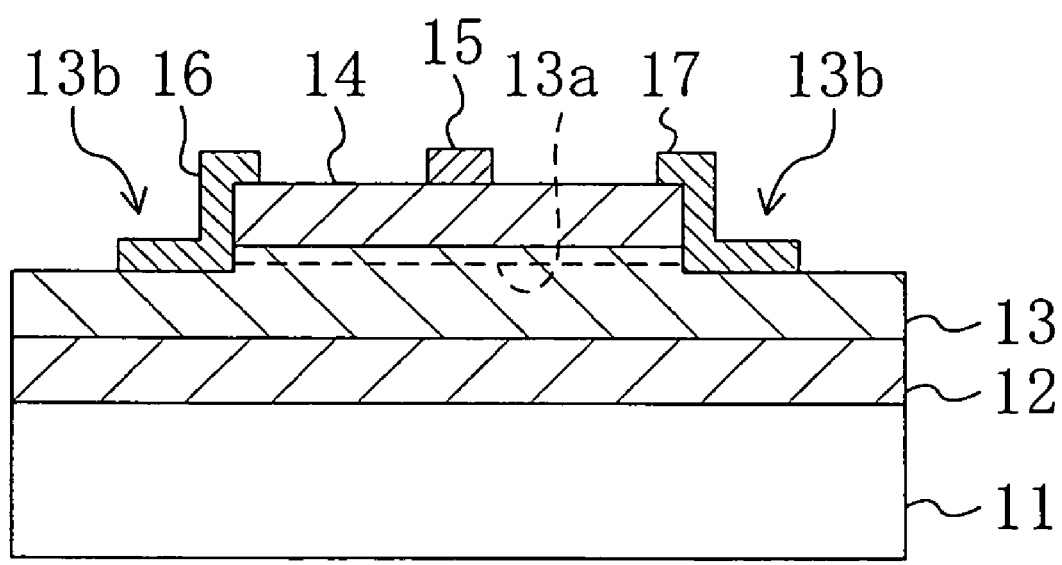
FIG. 6 is a structural cross-sectional view showing a semiconductor device according to a third embodiment of the present invention.

FIG. 6 shows a cross-sectional structure of a HFET as a semiconductor device according to the third embodiment. The description of the components shown in FIG. 6 which are the same as those shown in FIG. 1 will be omitted by retaining the same reference numerals.

In the first nitride semiconductor layer 13 according to the third embodiment, each of contact areas 13b as regions to be formed with the source and drain electrodes 16 and 17 as the ohmic electrodes is configured as a stepped portion composed of an exposed portion formed by partly lowering the upper surface of the first nitride semiconductor layer 13 to a level reaching the 2-dimensional electron gas layer 13a and of an end portion of the second semiconductor layer 14 facing the exposed portion of the first semiconductor layer. Accordingly, the source and drain electrodes 16 and 17 are formed to cover the respective stepped portions.

According to the third embodiment, the source and drain electrodes 16 and 17 are allowed to be in direct contact with the 2DEG layer 13a so that not only the contact resistance but also a channel resistance are reduced, which greatly improves the operating characteristics of the device.

Preferably, an n-type dopant composed of silicon or the like is introduced into each of the end portions of the second nitride semiconductor layer 14 facing the respective contact areas (stepped portions) 13b to come in contact with the 2DEG layer 13a. The arrangement lowers potential barriers between the first and second nitride semiconductor layers 13 and 14 and the ohmic electrodes 16 and 17 and thereby further reduces the contact resistance of each of the ohmic electrodes 16 and 17.

Figure 7A:
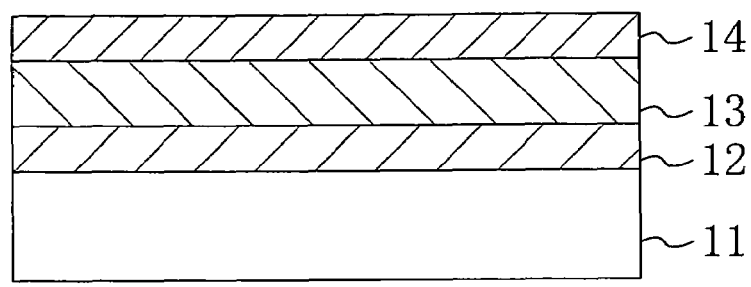
FIGS. 7A to 7C are structural cross-sectional views illustrating the semiconductor device according to the third embodiment in the individual process steps of a fabrication method therefor.
Figure 7B:
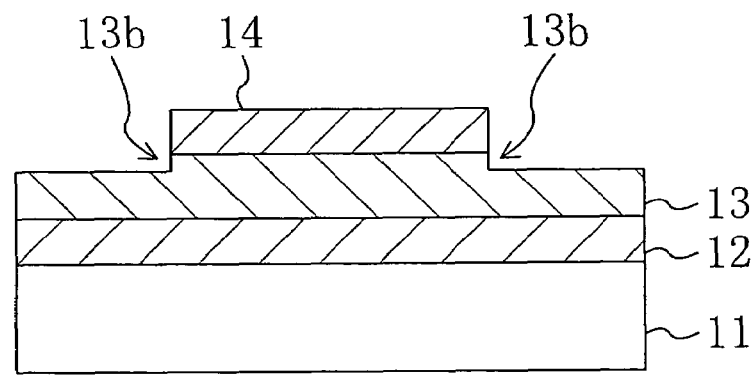
Figure 7C:
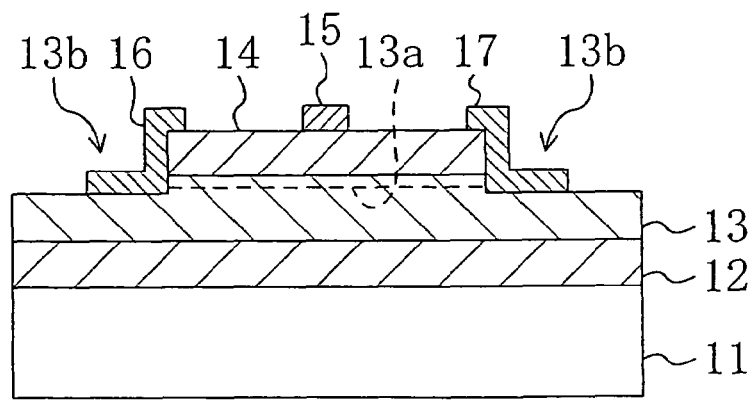

A description will be given herein below to a method for fabricating the HFET thus constructed with reference to the drawings. FIGS. 7A to 7C show the cross-sectional structures of the HFET according to the third embodiment in the individual process steps of the fabrication method.

First, as shown in FIG. 7A, the buffer layer 12 made of aluminum nitride (AlN) or gallium nitride (GaN), the first nitride semiconductor layer 13 made of i-type gallium nitride (GaN), and the second nitride semiconductor layer 14 made of i-type aluminum gallium nitride ($Al_{0.26}Ga_{0.74}N$) are grown successively on the substrate 11 made of silicon carbide (SiC) by, e.g., MOCVD. As a method for depositing each of the nitride semiconductor layers, MBE may also be used instead of MOCVD.

Next, as shown in FIG. 7B, the respective regions of the second and first nitride semiconductor layers 14 and 13 to be formed into the contact areas are etched by lithography and dry etching using a chlorine gas which are performed by using, as a mask, a first resist pattern (not shown) having openings corresponding to the contact area forming regions.

The etching performed herein partly lowers the upper surface of the first nitride semiconductor layer 13 to a depth of about 10 nm.

Next, as shown in FIG. 7C, the first resist pattern is removed and then a second resist pattern (not shown) having openings for exposing the contact areas 13b is formed by lithography on the second nitride semiconductor layer 14. On the second resist pattern formed, an electrode forming film composed of a multilayer film made of titanium and aluminum is deposited by, e.g., electron beam vapor deposition. Then, the ohmic source and drain electrodes 16 and 17 composed of the electrode forming film are formed on the respective contact areas 13b by a lift-off process. Subsequently, a third resist pattern (not shown) having an opening for exposing a region to be formed with a gate electrode between the source and drain electrodes 16 and 17 is formed and a gate electrode forming film composed of a multilayer film made of nickel and gold is deposited by, e.g., electron beam vapor deposition. By further performing a lift-off process, the gate electrode 15 is formed from the gate electrode forming film. It is to be noted that the order in which the source and drain electrodes 16 and 17 and the gate electrode 15 are formed is also insignificant herein.

Embodiment 4

A fourth embodiment of the present invention will be described with reference to the drawings.

Figure 8:
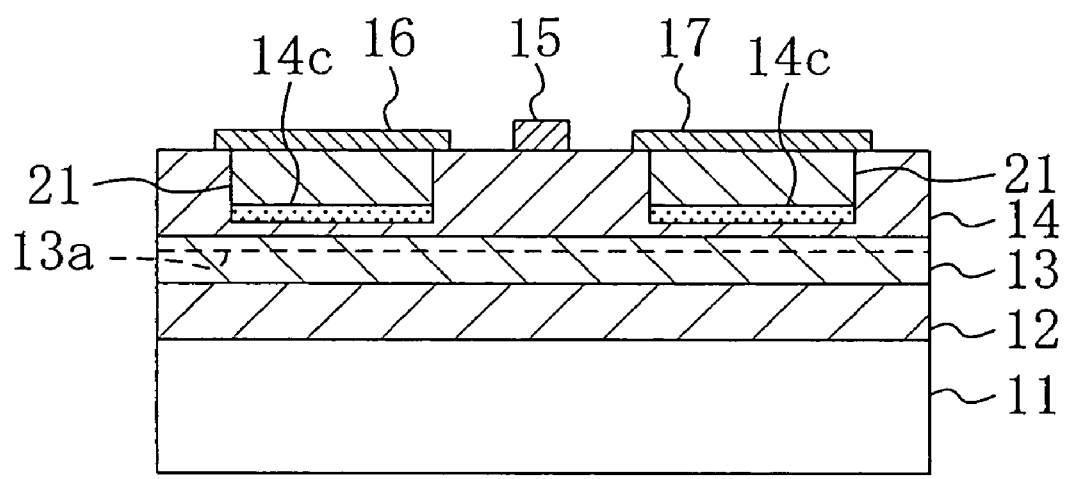
FIG. 8 is a structural cross-sectional view showing a semiconductor device according to a fourth embodiment of the present invention.

FIG. 8 shows a cross-sectional structure of a HFET as a semiconductor device according to the fourth embodiment. The description of the components shown in FIG. 8 which are the same as those shown in FIG. 1 will be omitted by retaining the same reference numerals.

In the fourth embodiment, third nitride semiconductor layers each made of n-type aluminum gallium nitride ($Al_{0.26}Ga_{0.74}N$) containing silicon are buried in the respective regions of the second nitride semiconductor layer 14 to be formed with the source and drain electrodes 16 and 17 as the ohmic electrodes which are located under the individual electrodes 16 and 17 and the buried third nitride semiconductor layers form contact areas 21.

In addition, doped regions 14c containing a dopant of the same conductivity type as that of the third nitride semiconductor layers are formed in the regions of the second nitride semiconductor layer 14 located in the vicinity of the interfaces with the contact areas 21.

According to the fourth embodiment, the potential barrier of electrons between the second nitride semiconductor layer 14 and each of the ohmic electrodes 16 and 17 can be lowered by providing the contact areas 21 composed of the third nitride semiconductor layers containing, e.g., an n-type dopant. In addition, the doped regions 14c also lower the potential barrier between the second nitride semiconductor layer 14 and each of the contact areas 21 (the third nitride semiconductor layers). As a result, it becomes possible to reduce the contact resistance without reducing the concentration of the electron gas in the 2DEG layer 13a and thereby improve the operating characteristics of the device.

Although the doped regions 14c have been provided in the regions of the second nitride semiconductor layer 14 in contact with the contact areas 21, the doped regions 14c need not necessarily be provided.

It can also be considered to impart a conductivity to the second nitride semiconductor layer 14 instead of burying, in the second nitride semiconductor layer 14, the third nitride semiconductor layers having the same composition and the same conductivity type as the second nitride semiconductor layer 14. However, the second nitride semiconductor layer 14 imparted with a conductivity can reduce the contact resistance but aggravates scattering by a dopant, e.g., scattering by a donor if the conductivity is of n-type so that the RF characteristics of the transistor are degraded. If the second nitride semiconductor layer 14 is composed of i-type aluminum gallium nitride in the same manner as in each of the foregoing embodiments, the concentration of the electron gas in the 2DEG layer 13a is reduced and the contact resistance is increased disadvantageously. Thus, the second nitride semiconductor layer 14 has a region where an amount of an impurity with which it is doped is optimum.

Accordingly, the fourth embodiment has selectively introduced the impurity only in the respective contact areas 21 underlying the ohmic electrodes 16 and 17 and thereby achieved a sufficient reduction in the contact resistance of each of the ohmic electrodes 16 and 17 without degrading the RF characteristics.

A description will be given herein below to a method for fabricating the HFET thus constructed with reference to the drawings. FIGS. 9A to 9D show the cross-sectional structures of the HFET according to the fourth embodiment in the individual process steps of the fabrication method.

Figure 9A:
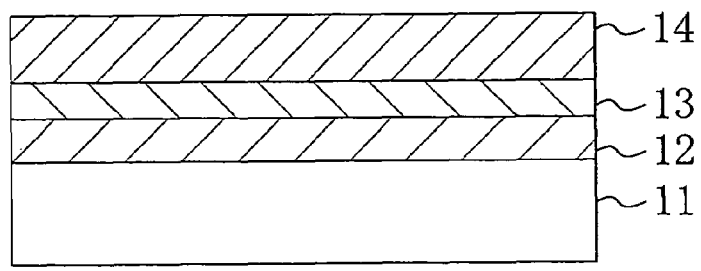
FIGS. 9A to 9D are structural cross-sectional views illustrating the semiconductor device according to the fourth embodiment in the individual process steps of a fabrication method therefor.

First, as shown in FIG. 9A, the buffer layer 12 made of aluminum nitride (AlN) or gallium nitride (GaN), the first nitride semiconductor layer 13 made of i-type gallium nitride (GaN), and the second nitride semiconductor layer 14 made of i-type aluminum gallium nitride ($Al_{0.26}Ga_{0.74}N$) are grown successively on the substrate 11 made of silicon carbide (SiC) by, e.g., MOCVD. As a method for depositing each of the nitride semiconductor layers, MBE may also be used instead of MOCVD.

Figure 9B:
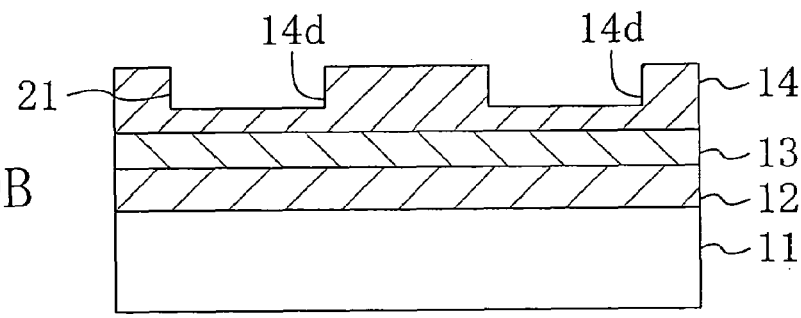

Next, as shown in FIG. 9B, the contact area forming regions 14d of the second nitride semiconductor layer 14 are etched by lithography and dry etching using a chlorine gas which are performed by using, as a mask, a first resist pattern (not shown) having openings corresponding to the contact area forming regions 14d. It is preferred herein to position the lowermost portion of each of the contact area forming regions 14d at a distance of not less than 1 nm from the 2DEG layer 13a.

Figure 9C:
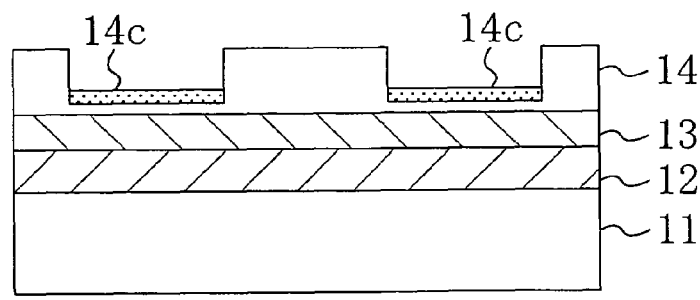

Next, as shown in FIG. 9C, ions of, e.g., silicon are implanted by ion implantation using a first resist pattern not shown or a second resist pattern (not shown) having the same pattern as the first resist pattern as a mask to form the n-type doped regions 14c in the exposed portions of the contact area forming regions 14d of the second nitride semiconductor layer 14.

Figure 9D:
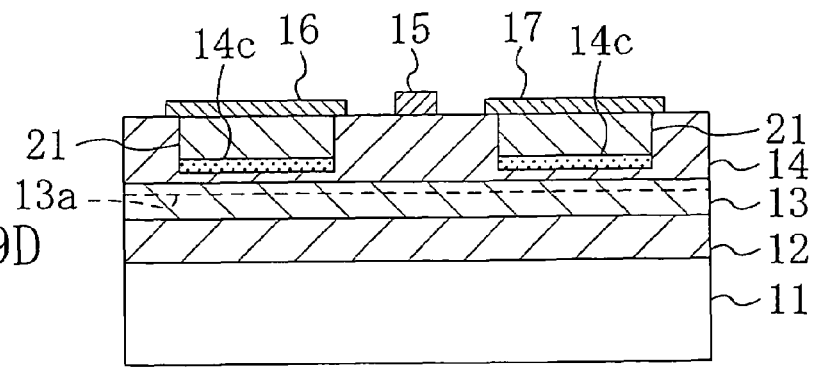

Next, as shown in FIG. 9D, a mask film (hard mask) (not shown) made of silicon oxide ($SiO_2$) or the like having openings corresponding to the contact area forming regions 14d is formed by CVD and the third nitride semiconductor layers are regrown, while doping them with silicon having the same conductivity type as the doped regions 14c by using the formed mask film, so that the contact areas 21 composed of the third nitride semiconductor layers are formed.

Thereafter, a third resist pattern (not shown) having openings for exposing the contact areas 21 is formed on the second nitride semiconductor layer 14 by lithography and an electrode forming film composed of a multilayer film made of titanium and aluminum is deposited on the formed third resist pattern by, e.g., electron beam vapor deposition. Then, the ohmic source and drain electrodes 16 and 17 each composed of the electrode forming film are formed on the respective contact areas 21 by a lift-off process. Subsequently, a fourth resist pattern (not shown) having an opening for exposing a region to be formed with a gate electrode between the source and drain electrodes 16 and 17 is formed and a gate electrode forming film composed of a multilayer film made of nickel and gold is deposited by, e.g., electron beam vapor deposition. By further performing a lift-off process, the gate electrode 15 is formed from the gate electrode forming film. It is to be noted that the order in which the source and drain electrodes 16 and 17 and the gate electrode 15 are formed is also insignificant herein.

It is also possible to provide a sidewall made of, e.g., silicon oxide ($SiO_2$) on the inner wall surface of each of the contact area forming regions 14d.

Embodiment 5

A fifth embodiment of the present invention will be described with reference to the drawings.

Figure 10:
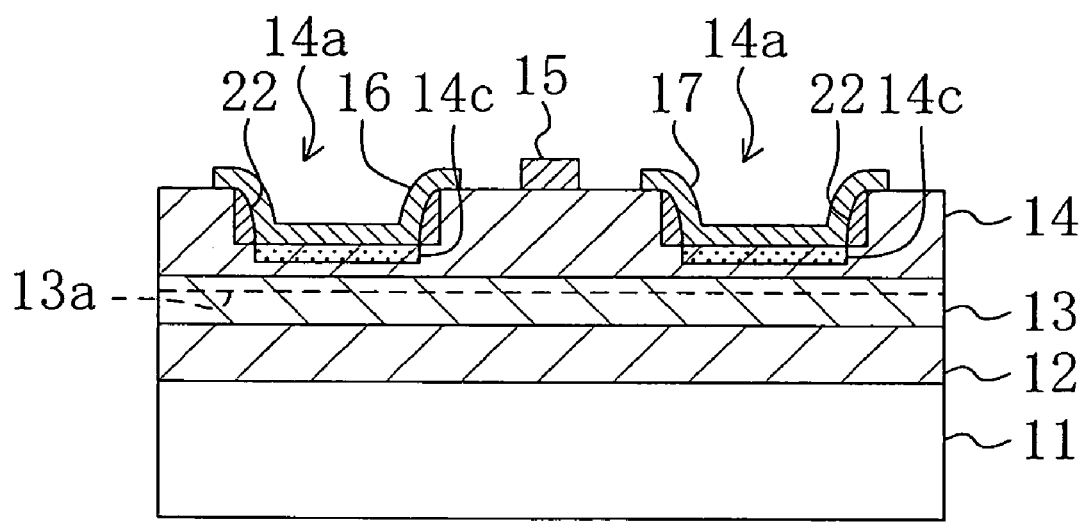
FIG. 10 is a structural cross-sectional view showing a semiconductor device according to a fifth embodiment of the present invention.

FIG. 10 shows a cross-sectional structure of a HFET as a semiconductor device according to the fifth embodiment. The description of the components shown in FIG. 10 which are the same as those shown in FIG. 1 will be omitted by retaining the same reference numerals.

In the fifth embodiment, the respective contact areas 14a each having a depressed cross-sectional configuration to be formed with the source and drain electrodes 16 and 17 as the ohmic electrodes are formed in the second nitride semiconductor layer 14 and the doped regions 14c containing a dopant having an n-type conductivity are formed in the respective regions of the second nitride semiconductor layer 14 which are located under the ohmic electrodes 16 and 17. In addition, sidewalls 22 made of, e.g., silicon oxide ($SiO_2$) are provided on the inner wall surfaces of the contact areas 14a.

Preferably, the second nitride semiconductor layer 14 has a thickness of about 2 nm to 1 μm.

Preferably, the lowermost portion of each of the contact areas 14a is positioned at a distance of not less than 1 nm and not more than 1 μm from the 2DEG layer 13a.

According to the fifth embodiment, the dopant has been introduced into the bottom portion of each of the contact areas 14a of the second nitride semiconductor layer 14 so that the potential barrier between the second nitride semiconductor layer 14 and each of the ohmic electrodes 16 and 17 is reduced. In addition, the sidewalls 22 provided on the respective inner wall surfaces of the contact areas 14a each defining a depressed cross-sectional configuration prevent the wall surfaces damaged by etching during the formation of the contact areas 14a from being exposed and thereby prevents a leakage current from flowing via a surface level developed at the wall surfaces by the etching damage.

As a result, the contact resistance can be reduced by providing the contact areas 14a each defining a depressed cross-sectional configuration to bring the ohmic electrodes 16 and 17 provided on the second nitride semiconductor layer 14 closer to the 2DG layer 13a and the doped regions 14c provided in the respective bottom portions of the contact areas 14a to reduce the potential barriers, while the operating characteristics of the transistor can be improved by providing the sidewalls 22 covering the wall surfaces damaged by etching.

A description will be given herein below to a method for fabricating the HFET thus constructed with reference to the drawings. FIGS. 11A to 11D show the cross-sectional structures of the HFET according to the fifth embodiment in the individual process steps of the fabrication method.

Figure 11A:
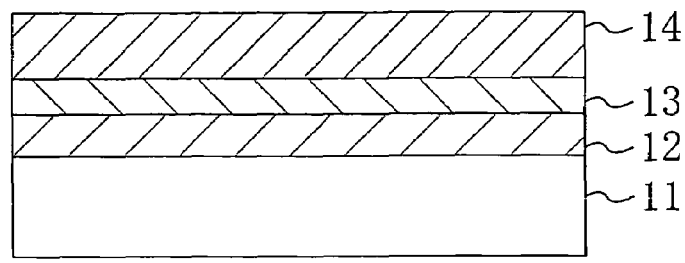
FIGS. 11A to 11D are structural cross-sectional views illustrating the semiconductor device according to the fifth embodiment in the individual process steps of a fabrication method therefor.

First, as shown in FIG. 11A, the buffer layer 12 made of aluminum nitride (AlN) or gallium nitride (GaN), the first nitride semiconductor layer 13 made of i-type gallium nitride (GaN), and the second nitride semiconductor layer 14 made of i-type aluminum gallium nitride ($Al_{0.26}Ga_{0.74}N$) are grown successively on the substrate 11 made of silicon carbide (SiC) by, e.g., MOCVD. As a method for depositing each of the nitride semiconductor layers, MBE may also be used instead of MOCVD.

Figure 11B:
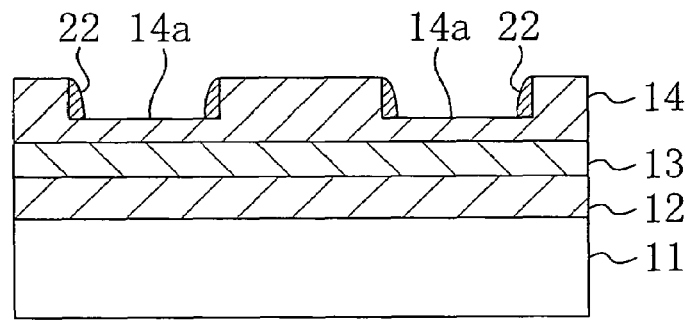

Next, as shown in FIG. 11B, the contact area forming regions of the second nitride semiconductor layer 14 are etched by lithography and dry etching using a chlorine gas which are performed by using, as a mask, a first resist pattern (not shown) having openings corresponding to the contact area forming regions so that the contact areas 14a each defining a depressed cross-sectional configuration are formed. It is preferred herein to position the lowermost portion of each of the contact areas 14a at a distance of not less than 1 nm from the 2DEG layer 13a.

Subsequently, the first resist pattern is removed and an insulating film made of silicon oxide is formed on the second nitride semiconductor layer 14 to cover the entire surface thereof including the contact areas 14a. The insulating film formed is etched back to form the sidewalls 22 each composed of the insulating film on the respective inner wall surfaces of the contact areas 14a.

Figure 11C:
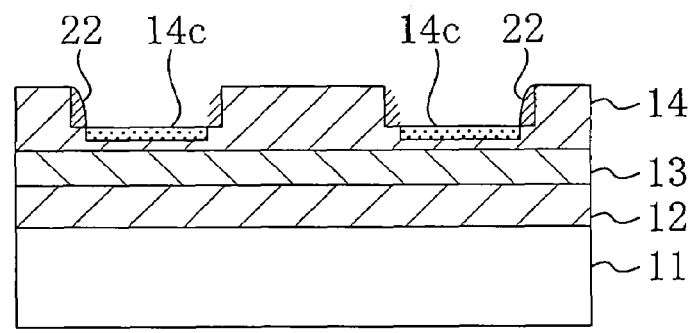

Next, as shown in FIG. 11C, ions of, e.g., silicon are implanted by ion implantation using a second resist pattern (not shown) having openings for exposing the respective contact areas 14a so that the n-type doped regions 14c are formed in the contact areas 14a of the second nitride semiconductor layer 14.

Figure 11D:
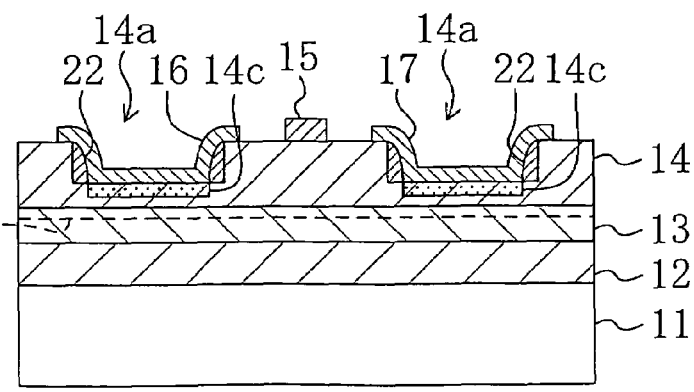

Next, as shown in FIG. 11D, the second resist pattern is removed and then a third resist pattern (not shown) having openings for exposing the contact areas 14a is formed on the second nitride semiconductor layer 14. On the third resist pattern formed, an electrode forming film composed of a multilayer film made of titanium and aluminum is deposited by, e.g., electron beam vapor deposition. Then, the ohmic source and drain electrodes 16 and 17 composed of the electrode forming film are formed on the respective contact areas 14a by a lift-off process. Subsequently, a fourth resist pattern (not shown) having an opening for exposing a region to be formed with a gate electrode between the source and drain electrodes 16 and 17 is formed and a gate electrode forming film made of nickel and gold is deposited by, e.g., electron beam vapor deposition. By further performing a lift-off process, the gate electrode 15 is formed from the gate electrode forming film. It is to be noted that the second resist pattern may also be used as a substitute for the third resist pattern and the order in which the source and drain electrodes 16 and 17 and the gate electrode 15 are formed is insignificant.

Embodiment 6

A sixth embodiment of the present invention will be described with reference to the drawings.

Figure 12A:
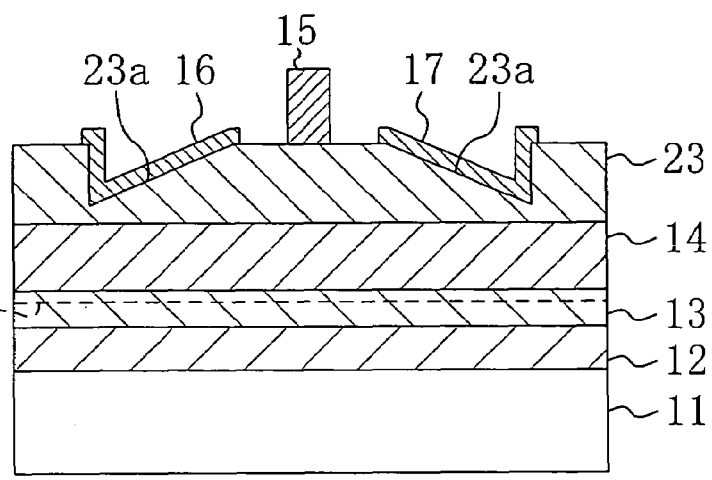
FIG. 12A is a structural cross-sectional view showing a semiconductor device according to a sixth embodiment of the present invention.

FIG. 12A shows a cross-sectional structure of a HFET as a semiconductor device according to the sixth embodiment. The description of the components shown in FIG. 12A which are the same as those shown in FIG. 1 will be omitted by retaining the same reference numerals.

As shown in FIG. 12A, the HEFT according to the sixth embodiment has a third nitride semiconductor layer 23 made of n-type gallium nitride (GaN) with a thickness of, e.g., about 50 nm which is formed, as a cap layer for forming an ohmic electrode, on the second nitride semiconductor layer 14 made of aluminum gallium nitride ($Al_{0.26}Ga_{0.74}N$) for generating the 2DEG layer 13a serving as a channel layer in the upper portion of the first nitride semiconductor layer 13. The third nitride semiconductor layer 23 contains silicon (Si) as an n-type dopant at a concentration of about $1 \times 10^{19}$ cm$^{-3}$.

A Schottky gate electrode 15 composed of a multilayer film made of, e.g., nickel (Ni) and gold (Au) is formed selectively on the third nitride semiconductor layer 23. The regions of the third nitride semiconductor layer 23 located on both sides of the gate electrode 15 have been formed into contact areas 23a each having an inclined portion with a bottom surface (upper surface) thereof being inclined outwardly toward the upper surface of the second nitride semiconductor layer 14 and defining a depressed cross-sectional configuration. On the respective contact areas 23a, ohmic source and drain electrodes 16 and 17 each composed of a multilayer film made of, e.g., titanium (Ti) and aluminum (Al) are formed to cover the respective bottom and wall surfaces of the contact areas 23a.

According to the sixth embodiment, the third nitride semiconductor layer 23 serving as the cap layer does not contain aluminum (Al) in the composition thereof, similarly to the first nitride semiconductor layer 13, so that the band gap energy thereof is smaller than that of the second nitride semiconductor layer 14 containing aluminum. Accordingly, the potential barrier between the third nitride semiconductor layer 23 and each of the ohmic electrodes 16 and 17 is reduced. In addition, the third nitride semiconductor layer 23 is provided with the contact areas 23a each defining a depressed cross-sectional configuration so that a series resistance down to the first nitride semiconductor layer 13 is reduced.

Since each of the contact areas 23a is formed to have a cross-sectional configuration which becomes deeper with distance from the gate electrode 15, wall surfaces substantially perpendicular to the substrate surface are on opposite sides of the gate electrode 15 so that a leakage current flowing via a surface level developed at the wall surfaces is suppressed. As a result, it becomes possible to improve the operating characteristics of the device, while reducing the contact resistance of each of the ohmic source and drain electrodes 16 and 17.

Variation 1 of Embodiment 6

Figure 12B:
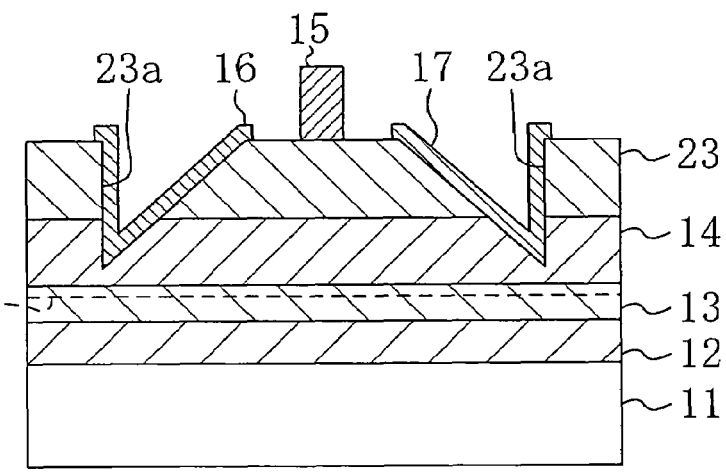
FIG. 12B is a structural cross-sectional view showing a semiconductor device according to a first variation of the sixth embodiment of the present invention.

FIG. 12B shows a cross-sectional structure of a HFET according to a first variation of the sixth embodiment. As shown in FIG. 12B, in the HFET according to the first variation, the inclined portion of each of the contact areas 23a defining a depressed cross-sectional configuration extends through the third nitride semiconductor layer 23 to have the bottom corner thereof reaching the lower portion of the second nitride semiconductor layer 14.

Preferably, the lowermost portion of each of the contact areas 23a is positioned at a distance of not less than 1 nm and not more than 1 µm from the 2DEG layer 13a.

In the arrangement, each of the contact areas 23a having the inclined bottom portions has at least one optimum region where the contact resistance is reduced and the concentration of the electron gas in the 2DEG layer 13a has a sufficient value, in the same manner as in the first embodiment. As a result, it becomes possible to further improve the operating characteristics of the device with the 2DEG layer 13a having a sufficient electron gas concentration, while reducing the contact resistance of each of the ohmic source and drain electrodes 16 and 17.

Variation 2 of Embodiment 6

Figure 12C:
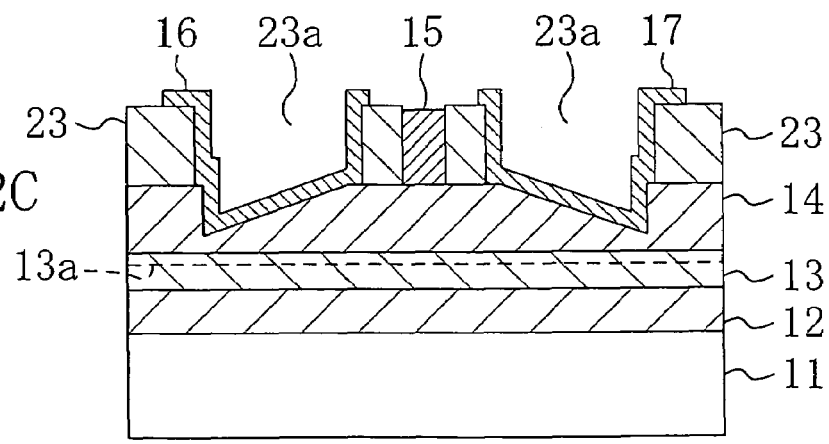
FIG. 12C is a structural cross-sectional view showing a semiconductor device according to a second variation of the sixth embodiment of the present invention.

FIG. 12C shows a cross-sectional structure of a HFET according to a second variation of the sixth embodiment. As shown in FIG. 12C, in the HEFT according to the second variation, the respective inclined portions of the contact areas 23a each defining a depressed cross-sectional configuration are entirely provided in the second nitride semiconductor layer 23 under the third nitride semiconductor layer 23.

It is also preferred herein that the lowermost portion of each of the contact areas 23a is positioned at a distance of not less than 1 nm and not more than 1 µm from the 2DEG layer 13a.

The arrangement further reduces the contact resistance than in the first variation and provides at least one optimum region where the concentration of the electron gas in the 2DEG layer 13a has a sufficient value. As a result, it becomes possible to further improve the operating characteristics of the device with the 2DEG layer 13a having a sufficient electron gas concentration, while further reducing the contact resistance of each of the ohmic source and drain electrodes 16 and 17.

Although silicon carbide (SiC) has been used for the substrate 11 in each of the first to sixth embodiments, it is also possible to use sapphire (monocrystalline $Al_2O_3$), silicon (Si), or gallium arsenide (GaAs) instead.

For the buffer layer 12, a multilayer structure made of aluminum nitride and gallium nitride may also be used.

In the composition of aluminum gallium nitride ($Al_xGa_{1-x}N$) composing the second nitride semiconductor layer 14, x representing an Al composition ratio is not limited to 0.26 provided that it satisfies $0.1 \leq x \leq 0.5$.

The composition of the second nitride semiconductor layer 14 is sufficient provided that the band gap energy thereof is larger than that of the first nitride semiconductor layer 13. If the first nitride semiconductor layer 13 is composed of, e.g., indium gallium nitride (InGaN) instead of gallium nitride (GaN), x representing the Al composition ratio may also be set to 0. If the first nitride semiconductor layer 13 is composed of aluminum gallium nitride ($Al_yGa_{1-y}N$), on the other hand, it is necessary to adjust y representing the Al composition ratio in the first nitride semiconductor layer 13 to be smaller than x representing the Al composition ratio in the second nitride semiconductor layer 14.

The material of the first nitride semiconductor layer 13 is not limited to i-type. It is also possible to use an n-type material to compose the first nitride semiconductor layer 13a having a single-layer or multilayer structure such that the carrier concentration therein has a specified distribution, e.g., a distribution in which the carrier concentration increases upwardly.

As the material of each of the electrodes 16 and 17, there can be used one metal selected from the group consisting of titanium (Ti: with a work function of 4.33 eV), strontium (Sr), aluminum (Al: with a work function of 4.28 eV), niobium (Nb: with a work function of 4.30 eV), vanadium (V: with a work function of 4.30 eV), zirconium (Zr: with a work function of 4.05 eV), hafnium (Hf: with a work function of 3.90 eV), chromium (Cr: with a work function of 4.50 eV), tungsten (W: with a work function of 4.55 eV), molybdenum (Mo: with a work function of 4.60 eV), rhodium (Rh), rhenium (Re), cobalt (Co: with a work function of 5.00 eV), and lanthanum (La), a multilayer film made of at least two metals selected from the group, an alloy containing at least two metals selected from the group, or a conductive compound containing at least one metal selected from the group and oxygen (O), nitrogen (N), or boron (B).

Embodiment 7

A seventh embodiment of the present invention will be described with reference to the drawings.

Figure 13A:
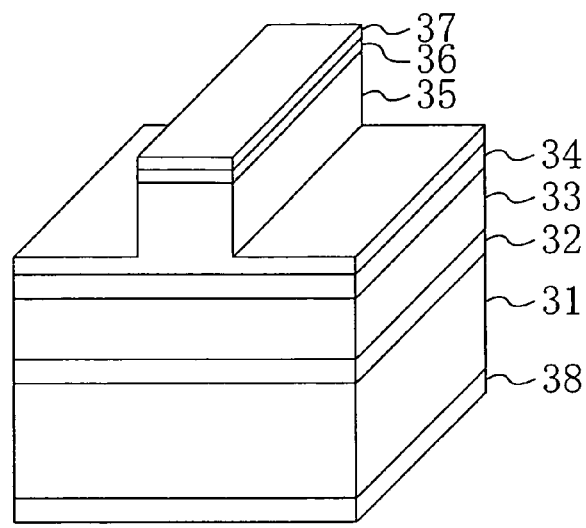
FIG. 13A is a perspective view showing a semiconductor device according to a seventh embodiment of the present invention.

FIG. 13 shows a semiconductor laser device as a semiconductor device according to the seventh embodiment. As shown in FIG. 13, the semiconductor laser device according to the seventh embodiment is composed of: a buffer layer 32 made of n-type gallium nitride (GaN) with a thickness of 2 μm; an n-type clad layer 33 made of n-type aluminum gallium nitride ($Al_{0.15}Ga_{0.85}N$) with a thickness of 1 μm; an active layer 34 made of indium gallium nitride ($In_{0.1}Ga_{0.9}N$) with a thickness of 3 nm; a p-type clad layer 35 made of p-type aluminum gallium nitride ($Al_{0.15}Ga_{0.85}N$) and having a ridge portion with a thickness of 1.2 μm; a p-type contact layer 36 made of p-type gallium nitride (GaN) with a thickness of 50 nm and having a depressed portion formed in the upper portion thereof; and a p-side ohmic electrode 37 composed of a multilayer structure made of, e.g., nickel (Ni), platinum (Pt), and gold (Au) and buried in the depressed portion of the p-type contact layer 36 which are formed successively on a substrate 31 made of, e.g., n-type gallium nitride (GaN) and also of: an n-type ohmic electrode 38 composed of a multilayer structure made of, e.g., titanium (Ti) and aluminum (Al) and formed on the surface of the substrate 31 opposite to the buffer layer 32.

Preferably, the active layer 34 has a multiple quantum well structure including 2 to 10 pairs of barrier layers made of gallium nitride and well layers made of indium gallium nitride.

As has been well known, holes injected from the p-side ohmic electrode 37 and electrons injected from the n-side ohmic electrode 38 recombine in the active layer 34 to generate light. The light resulting from the recombination is confined to resonate in the n-type clad layer 33 and the p-type clad layer 35, each of which is larger in band gap energy and refractive index than the active layer 34, and is outputted as a laser beam having a wavelength of about 400 nm from one end face of the active layer 34.

The seventh embodiment is characterized in that the p-side ohmic electrode 37 formed on the p-type contact layer 36 made of p-type gallium nitride is formed in the depressed portion formed in the upper portion of the p-type contact layer 36. The depressed portion has been formed to have a depth at a distance of about 1 nm from the peak position of the impurity concentration, i.e., an acceptor concentration, which is located therebelow.

Figure 13B:
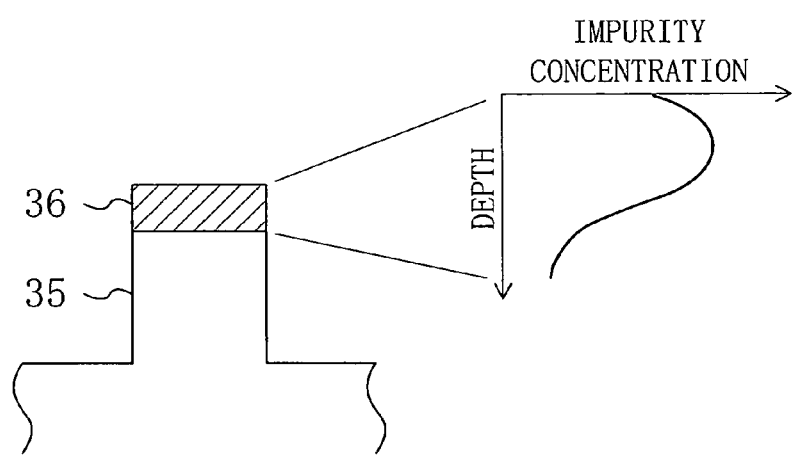
FIG. 13B is a pre-processing structural cross-sectional view of a p-type contact layer in the semiconductor device according to the seventh embodiment.

Specifically, the thickness of the p-type contact layer 36 is about 50 nm as shown in FIG. 13B and a specified concentration distribution is observed even when the p-type contact layer 36 is uniformly doped with magnesium as a p-type impurity by MOCVD or the like.

Figure 13C:
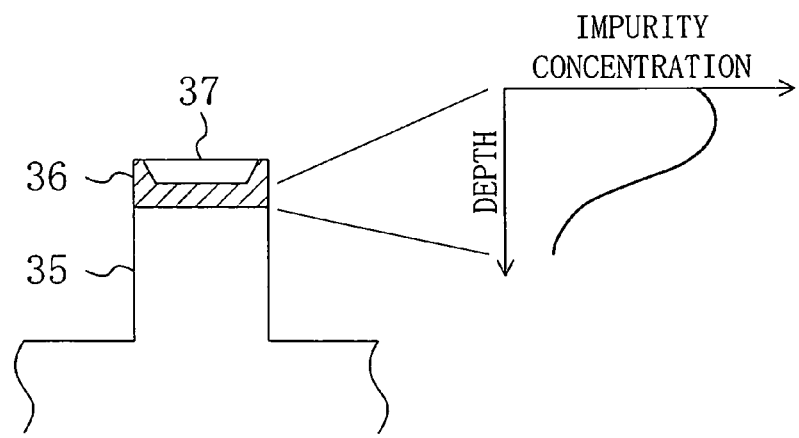
FIG. 13C is a post-processing structural cross-sectional view of the p-type contact layer in the semiconductor device according to the seventh embodiment.

In view of this, the present embodiment has removed the surface portion of the p-type contact layer 36 after growth to provide a spacing of about 1 nm between the bottom surface of the resulting depressed portion and the peak position of the acceptor concentration located therebelow by an etching or ion beam process prior to the formation of the p-side ohmic electrode 37, as shown in FIG. 13C. The distance between the bottom surface of the depressed portion and the peak position located therebelow may be adjusted appropriately to a value not less than about 1 nm and not more than 100 nm. The arrangement ensures a reduction in the contact resistance of the p-side ohmic electrode 37.

As the configuration of the p-type contact layer 36 with the depressed portion according to the seventh embodiment, the configuration of the contact area according to any of the first to fifth embodiments of the present invention may also be used.

Embodiment 8

An eighth embodiment of the present invention will be described with reference to the drawings.

FIG. 14 shows a HBT as a semiconductor device according to the eighth embodiment. As shown in FIG. 14, the HBT according to the eighth embodiment is composed of: a first buffer layer 42 made of aluminum nitride (AlN) with a thickness of about 20 nm; a second buffer layer 43 made of gallium nitride with a thickness of about 15 nm; a sub-collector layer 44 made of n-type gallium nitride (GaN) with a thickness of about 500 nm; a collector layer 45 made of n-type aluminum gallium nitride ($Al_{0.1}Ga_{0.9}N$) with a thickness of about 500 mm; a base layer 46 made of p-type gallium nitride (GaN) with a thickness of about 70 nm; and an emitter layer 47 made of n-type aluminum gallium nitride ($Al_{0.25}Ga_{0.75}N$) with a thickness of about 30 nm which are formed successively on a substrate 41 made of, e.g., sapphire.

An ohmic emitter electrode 48 composed of a multilayer structure made of, e.g., nickel (Ni), platinum (Pt), and gold (Au) is formed on the emitter layer 47. An ohmic base electrode 49 composed of a multilayer structure made of, e.g., titanium (Ti) and aluminum (Al) is formed on the partly exposed portion of the base layer 46. An ohmic collector electrode 50 composed of a multilayer structure made of, e.g., titanium (Ti) and aluminum (Al) is formed on the partly exposed portion of the sub-collector layer 44.

The eighth embodiment is characterized in that the base layer 46 made of p-type gallium nitride has a contact area 46a formed by partly removing an upper portion of the base layer 46 to reach a level substantially coincident with the peak position of the p-type impurity concentration in the base layer 46, i.e., the acceptor concentration and the base electrode 49 is formed on the depressed contact area 46a.

Figure 14B:
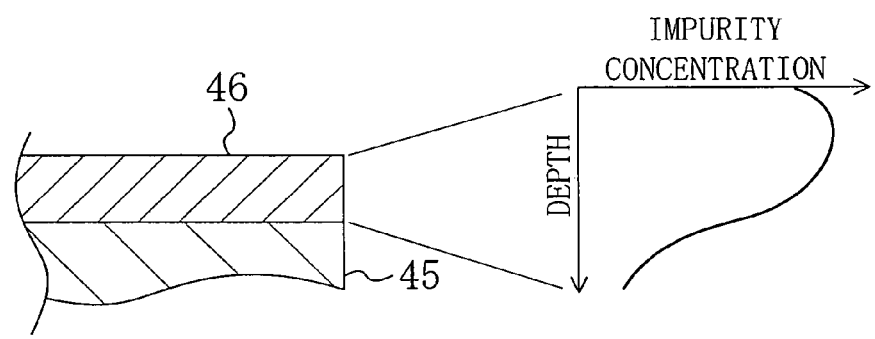
FIG. 14B is a pre-processing structural cross-sectional view of a base layer in the semiconductor device according to the eighth embodiment.

As shown in FIG. 14B, a specified concentration distribution is observed in the p-type base layer 46 after crystal growth even when the base layer 46 is uniformly doped with magnesium as a p-type impurity by MOCVD or the like.

Figure 14C:
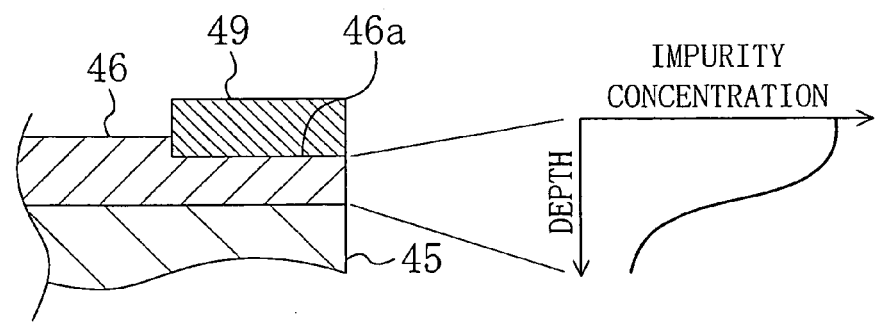
FIG. 14C is a post-processing structural cross-sectional view of the base layer in the semiconductor device according to the eighth embodiment.

In view of this, the present embodiment has removed the entire surface of the exposed based layer 46 or at least one part thereof before forming the base electrode 49 such that the level of the bottom surface of the resulting depressed portion is coincident with the peak position of the acceptor concentration, as shown in FIG. 14C. The arrangement ensures a reduction in the contact resistance of the base electrode 49.

Referring to the drawings, a description will be given to a method for fabricating the HBT thus constructed. FIGS. 15A to 15D show the cross-sectional structures of the HBT according to the eighth embodiment in the individual process steps of the fabrication method.

Figure 15A:
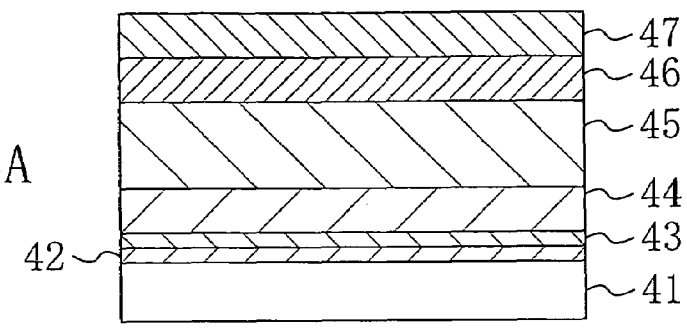
FIGS. 15A to 15D are structural cross-sectional views illustrating the semiconductor device according to the eighth embodiment in the individual process steps of a fabrication method therefor.

First, as shown in FIG. 15A, the first buffer layer 42 made of aluminum nitride (AlN) with a thickness of about 20 nm and the second buffer layer 43 made of gallium nitride (GaN) with a thickness of about 15 nm are formed by, e.g., MBE on the substrate 41 made of sapphire. Then, the sub-collector layer 44 made of n-type gallium nitride (GaN) with a thickness of about 500 nm and doped with silicon (Si) at a relatively high concentration of $1 \times 10^{19}$ cm$^{-3}$ and the collector layer 45 made of n-type aluminum gallium nitride ($Al_{0.1}Ga_{0.9}N$) with a thickness of about 500 nm and doped with silicon (Si) at a concentration of $2\times10^{17}$ cm$^{-3}$ are formed successively on the nitrogen surface of the second buffer layer 43. Subsequently, the base layer 46 made of p-type gallium nitride (GaN) with a thickness of about 70 nm and doped with magnesium (Mg) at a relatively high concentration of $4\times10^{19}$ cm$^{-3}$ is formed on the collector layer 45. Thereafter, the emitter layer 47 made of n-type aluminum gallium nitride ($Al_{0.25}Ga_{0.75}N$) with a thickness of about 30 nm and doped with silicon (Si) at a concentration of $5\times10^{17}$ cm$^{-3}$ is formed on the base layer 46.

Figure 15B:
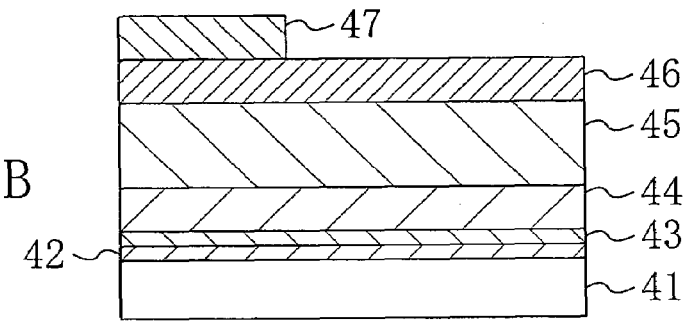

Next, as shown in FIG. 15B, a first mask pattern (not shown) made of silicon oxide for masking the emitter formation region is formed on the emitter layer 47 and dry etching is performed by using a chlorine gas and the first mask pattern formed, thereby forming an emitter mesa and exposing the underlying base layer 46.

Figure 15C:
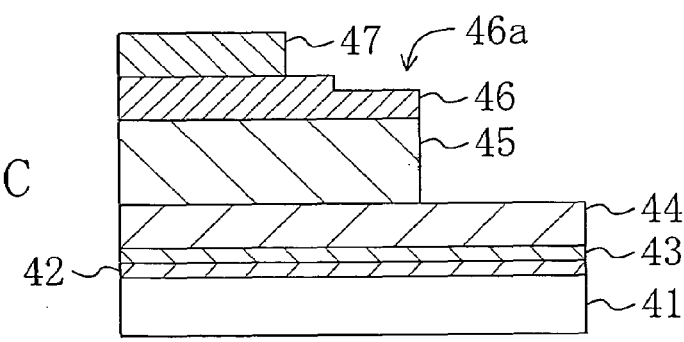

Next, as shown in FIG. 15C, the first mask pattern is removed and then a second mask pattern (not shown) made of silicon oxide for masking the emitter layer 47 and the base formation region of the exposed base layer 46 is formed. Dry etching is performed with respect to the base layer 46 and the collector layer 45 by using a chlorine gas the second mask pattern formed, thereby forming a base mesa and a collector mesa and exposing the sub-collector layer 44.

Subsequently, the entire surface of the exposed base layer 46 or at least one part thereof is removed by an etching or ion beam process so that the contact area 46a having the bottom portion thereof at a level substantially coincident with the peak position of the acceptor concentration is formed. The contact area 46a may also be formed before the sub-collector layer 44 is exposed.

Figure 15D:
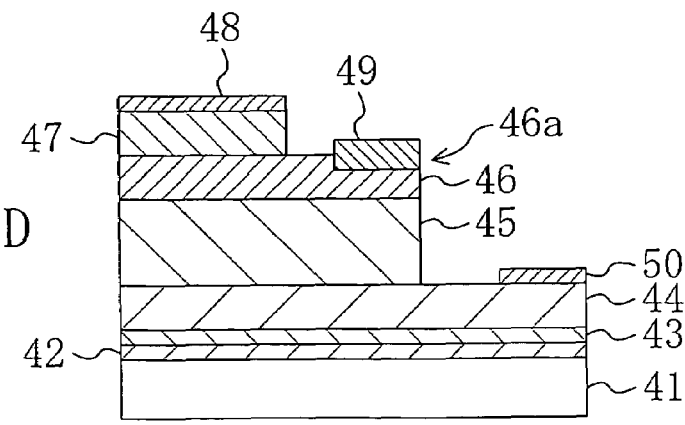
Figure 16:
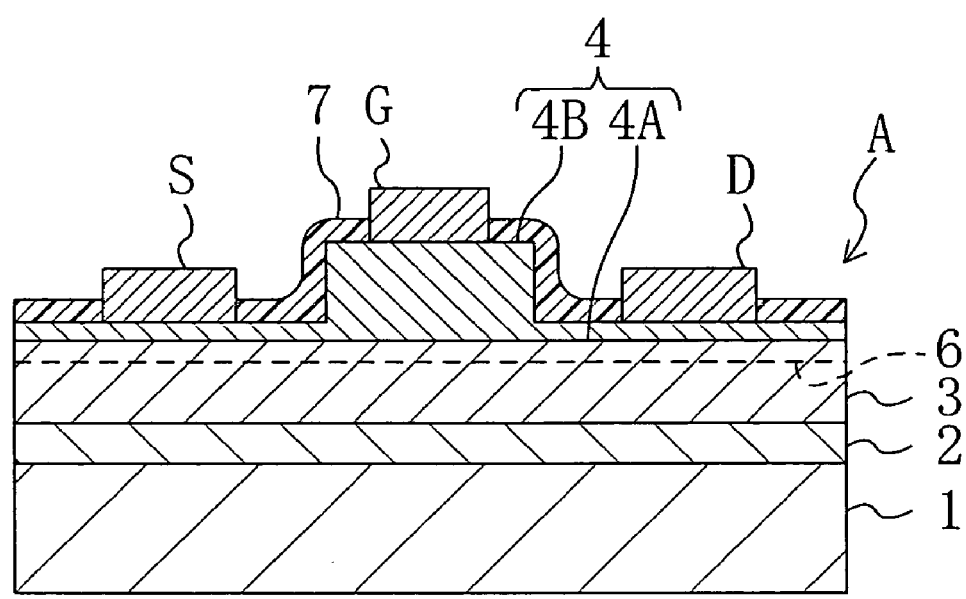
FIG. 16 is a structural cross-sectional view showing a conventional semiconductor device (HFET).

Next, as shown in FIG. 15D, the second mask pattern is removed. Then, the emitter electrode 48 is formed on the emitter layer 47, the base electrode 49 is formed on the contact area 46a of the base layer 46, and the collector electrode 50 is formed on the sub-collector layer 44, each by, e.g., electron beam vapor deposition. It is to be noted that the order in which the individual electrodes 48, 49, and 50 are formed is insignificant.

In the arrangement, an electric field is generated in the base layer 46 from the collector layer 45 toward the emitter layer 47 so that the transit time of carriers is reduced and the RF characteristics are improved.

In addition, the electric field generated in the base layer 46 accumulates holes in the vicinity of the base electrode 49 so that the base resistance is reduced.

The contact area 46a provided in the base layer 46 according to the eight embodiment may also be applied to a bipolar transistor not having a heterojunction.

It is also possible to apply the configuration of the contact area according to any of the first to fifth embodiments of the present invention to the cross-sectional configuration of the contact area 46a provided in the base layer 46 according to the eighth embodiment.

Thus, the semiconductor device according to the present invention and the fabrication method therefor have the effects of reducing the contact resistance of an ohmic electrode provided on a group III-V nitride semiconductor and implementing a higher-speed and higher-output semiconductor device using the nitride semiconductor. Hence, the present invention is applied usefully to a semiconductor device having an ohmic electrode formed on a nitride semiconductor layer or the like.

What is claimed is:

1. A semiconductor device comprising:
   a first nitride semiconductor layer;
   a second nitride semiconductor layer formed on the first nitride semiconductor layer and having such a composition as to generate a 2-dimensional electron gas layer in an upper portion of the first nitride semiconductor layer; and
   an ohmic electrode formed selectively on the second nitride semiconductor layer, wherein the second nitride semiconductor layer includes a contact area having at least one inclined surface which is inclined toward an upper surface of the first nitride semiconductor layer and defining a depressed cross-sectional configuration and
   the ohmic electrode is formed on the contact area.

2. The semiconductor device of claim 1, wherein a lowermost portion of the contact area is positioned at a distance of not less than 1 nm and not more than 1 μm from the 2-dimensional electron gas layer.

3. The semiconductor device of claim 1, wherein a bottom portion of the contact area is formed with a striped pattern which is projecting and depressed in cross section with a periodicity of not less than 1 nm and not more than 1 μm.

4. The semiconductor device of claim 1, wherein the ohmic electrode is formed to cover at least one of the inclined surface of the contact area.

5. The semiconductor device of claim 1, wherein the ohmic electrode is composed of one layer made of a metal selected from the group consisting of titanium, strontium, aluminum, niobium, vanadium, zirconium, hafnium, chromium, tungsten, molybdenum, rhodium, rhenium, cobalt, and lanthanum, of at least two layers each made of a metal selected from the group, of an alloy layer containing at least two metals selected from the group, or of a conductive compound containing at least one metal selected from the group and oxygen, nitrogen, or boron.

6. The semiconductor device of claim 1, wherein
   a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$),
   a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$), and
   a composition of the second nitride semiconductor layer and a composition of the first nitride semiconductor layer are such that u representing an Al ratio is larger than x representing an Al ratio and v representing an In ratio is smaller than y representing an In ratio.

7. A semiconductor device comprising:
   a first nitride semiconductor layer;
   a second nitride semiconductor layer formed on the first nitride semiconductor layer and having such a composition as to generate a 2-dimensional electron gas layer in an upper portion of the first nitride semiconductor layer; and
   an ohmic electrode formed selectively on the second nitride semiconductor layer, wherein the second nitride semiconductor layer has a contact area defining a depressed cross-sectional configuration,
   the contact area has a bottom portion containing an impurity having a conductivity introduced therein and a sidewall composed of an insulating film on an inner wall surface thereof, and
   the ohmic electrode is formed to cover an inner side of the contact area including the sidewall.

8. The semiconductor device of claim 7, wherein the ohmic electrode is composed of one layer made of a metal selected from the group consisting of titanium, strontium, aluminum, niobium, vanadium, zirconium, hafnium, chromium, tungsten, molybdenum, rhodium, rhenium, cobalt, and lanthanum, of at least two layers each made of a metal selected from the group, of an alloy layer containing at least two metals selected from the group, or of a conductive compound containing at least one metal selected from the group and oxygen, nitrogen, or boron.

9. The semiconductor device of claim 7, wherein
a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$),
a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$), and
a composition of the second nitride semiconductor layer and a composition of the first nitride semiconductor layer are such that u representing an Al ratio is larger than x representing an Al ratio and v representing an In ratio is smaller than y representing an In ratio.

10. A semiconductor device comprising:
a first nitride semiconductor layer;
a second nitride semiconductor layer formed on the first nitride semiconductor layer and having such a composition as to generate a 2-dimensional electron gas layer in an upper portion of the first nitride semiconductor layer;
a third nitride semiconductor layer formed on the second nitride semiconductor layer and smaller in band gap energy than the second nitride semiconductor layer; and
an ohmic electrode formed selectively on the third nitride semiconductor layer, wherein
the third nitride semiconductor layer includes a contact area having at least one inclined surface which is inclined toward an upper surface of the second nitride semiconductor layer and defining a depressed cross-sectional configuration and
the ohmic electrode is formed on the contact area.

11. The semiconductor device of claim 10, wherein the ohmic electrode is composed of one layer made of a metal selected from the group consisting of titanium, strontium, aluminum, niobium, vanadium, zirconium, hafnium, chromium, tungsten, molybdenum, rhodium, rhenium, cobalt, and lanthanum, of at least two layers each made of a metal selected from the group, of an alloy layer containing at least two metals selected from the group, or of a conductive compound containing at least one metal selected from the group and oxygen, nitrogen, or boron.

12. The semiconductor device of claim 10, wherein
a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$),
a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$), and
a composition of the second nitride semiconductor layer and a composition of the first nitride semiconductor layer are such that u representing an Al ratio is larger than x representing an Al ratio and v representing an In ratio is smaller than y representing an In ratio.

13. The semiconductor device of claim 10, wherein
a general formula of a material composing the first nitride semiconductor layer is $Al_xIn_yGa_{1-x-y}N$ (where x and y satisfy $0 \leq x \leq 1$, $0 \leq y \leq 1$, and $0 \leq x+y \leq 1$),
a general formula of a material composing the second nitride semiconductor layer is $Al_uIn_vGa_{1-u-v}N$ (where u and v satisfy $0 \leq u \leq 1$, $0 \leq v \leq 1$, and $0 \leq u+v \leq 1$),
a general formula of a material composing the third nitride semiconductor layer is $Al_lIn_mGa_{1-l-m}N$ (where l and m satisfy $0 \leq l \leq 1$, $0 \leq m \leq 1$, and $0 \leq l+m \leq 1$),
a composition of the second nitride semiconductor layer and a composition of the first nitride semiconductor layer are such that u representing an Al ratio is larger than x representing an Al ratio and v representing an In ratio is smaller than y representing an In ratio, and
a composition of the third nitride semiconductor layer and the composition of the second nitride semiconductor layer are such that l representing an Al ratio is smaller than u representing the Al ratio.

14. The semiconductor device of claim 1, wherein
the second nitride semiconductor layer includes two contact areas,
a gate electrode is formed on the second nitride semiconductor layer,
the gate electrode is between the one contact area and the other contact area, and
depths of the inclined surfaces of the two contact areas become shallower with approach toward the gate electrode.

15. The semiconductor device of claim 1, wherein the depressed cross-sectional configuration of the contact area is V-shaped.

16. The semiconductor device of claim 10, wherein the inclined surface of the contact area reaches into the second nitride semiconductor layer.

17. The semiconductor device of claim 16, wherein the ohmic electrode is formed to cover both the inclined surface of the third nitride semiconductor layer and the inclined surface of the second nitride semiconductor layer.

18. The semiconductor device of claim 10, wherein
the third nitride semiconductor layer includes two contact areas,
a gate electrode is formed on the third nitride semiconductor layer,
the gate electrode is between the one contact area and the other contact area, and
depths of the inclined surfaces of the two contact areas become shallower with approach toward the gate electrode.

* * * * *